(12) United States Patent
Washio et al.

(10) Patent No.: US 8,253,433 B2
(45) Date of Patent: Aug. 28, 2012

(54) TESTING APPARATUS FOR INTEGRATED CIRCUIT

(75) Inventors: Kenichi Washio, Yokohama (JP);
Masashi Hasegawa, Tokyo (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 333 days.

(21) Appl. No.: 12/790,373

(22) Filed: May 28, 2010

(65) Prior Publication Data

US 2011/0001506 A1    Jan. 6, 2011

(30) Foreign Application Priority Data

Jul. 3, 2009    (JP) .................................. 2009-158805

(51) Int. Cl.
*G01R 31/02* (2006.01)
(52) U.S. Cl. .......... 324/762.01; 324/762.02; 324/757.02
(58) Field of Classification Search ........................ None
See application file for complete search history.

(56) References Cited

U.S. PATENT DOCUMENTS 7,377,788 B2 *   5/2008   Hasegawa ...................... 439/66
7,816,931 B2 * 10/2010   Hirakawa et al. ........ 324/754.07

FOREIGN PATENT DOCUMENTS

| JP | 10-510682 | 10/1998 |
|---|---|---|
| JP | 10-510682 T | 10/1998 |
| JP | 11-251383 | 9/1999 |
| JP | 2006-337080 | 12/2006 |
| JP | 2007-113946 | 5/2007 |
| JP | 2008-145224 | 6/2008 |
| JP | 2009-115477 | 5/2009 |
| WO | WO97/06444 | 2/1997 |

* cited by examiner

*Primary Examiner* — Melissa Koval
*Assistant Examiner* — Trung Nguyen
(74) *Attorney, Agent, or Firm* — Ingrassia Fisher & Lorenz, P.C.

(57) ABSTRACT

An apparatus for testing an integrated circuit comprises: a chip unit with a plurality of electronic parts such as chip units arranged on the upside of a chip support; a probe unit having a plurality of contacts arranged on the underside of a probe support and spaced downward from the chip unit; a connection unit supporting the probe unit spaced downward from the chip unit on a pin support so as to penetrate the pin support in an up-down direction; and a coupling unit which couples separably the chip unit, the probe unit and the connection unit and displaces one of the chip support and the probe support and the pin support in a direction to approach each other and to be away from each other relative to the connection unit.

14 Claims, 24 Drawing Sheets

Fig. 6
(A)
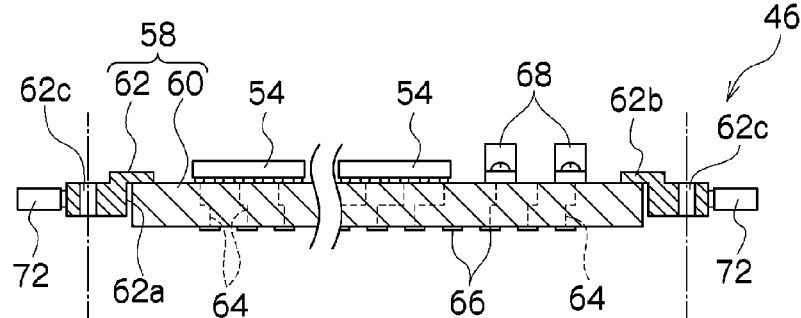
(B)
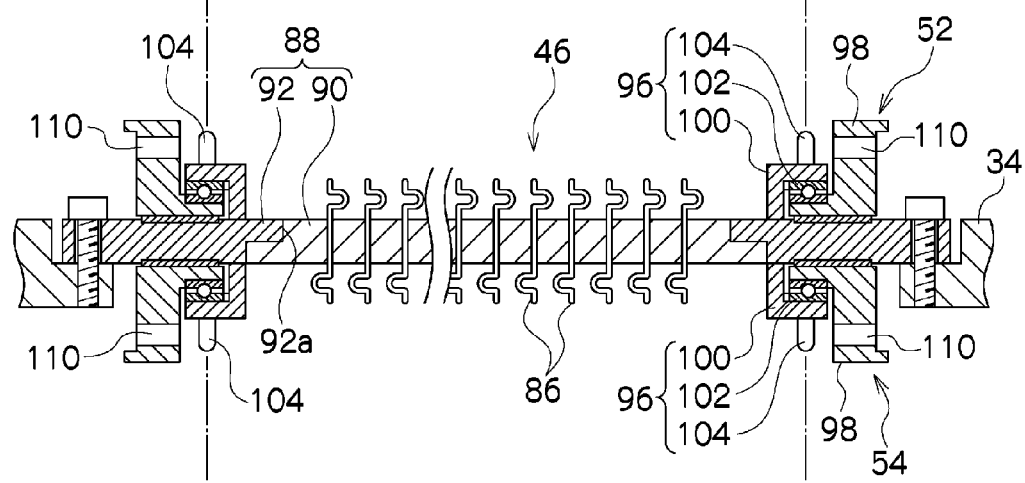
(C)
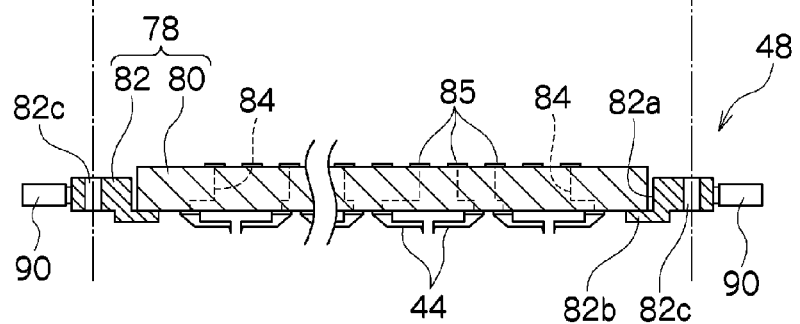

TESTING APPARATUS FOR INTEGRATED CIRCUIT

PRIORITY CLAIM

The instant application claims priority to Japanese Patent Application No. 2009-158805, filed Jul. 3, 2009, which application is incorporated herein by reference in its entirety.

TECHNICAL FIELD

An embodiment of subject matter relates to an apparatus for testing a semiconductor integrated circuit, and more particularly, to a testing apparatus suitable for testing a plurality of uncut integrated circuits formed in a wafer at one time or separately in several butches.

BACKGROUND

As an example of an apparatus for testing a plurality of uncut integrated circuits formed in a wafer at one time or separately in several batches, there is one using a chip unit having: a chip support and a plurality of test chips arranged on the upside of the chip support; a probe unit distanced downward from the chip unit and having a probe support and a plurality of contacts arranged on the underside of the probe support; and a connection unit disposed between the chip unit and the probe unit and provided with a pin support and a plurality of connection pins which penetrate the pin support vertically and whose upper ends and lower ends can project upward and downward of the pin support (Japanese National Patent Appln. Public Disclosure No. 10-510682 and No. 11-251383, which are incorporated by reference).

In the above prior art, each test chip generates an electrical signal for use in an electrical test of an integrated circuit, i.e., a device under test and has a function to process a response signal upon receipt of the response signal from the device under test. Thus, since the prior art does not require a plurality of wiring boards with a plurality of circuits which have a function of the test chips, a test head required before the prior art is remarkably minimized, so that the testing apparatus becomes less expensive.

The above conventional technique, however, merely stacks a chip unit, a probe unit and a connection unit in their thickness direction, and neither combines those three units nor have a support unit support the three units.

The present invention aims to couple at least one of the chip unit and the probe unit, and the connection unit so that the relative force between them can be adjusted.

SUMMARY

An embodiment of an apparatus for testing an integrated circuit comprises: a chip unit provided with a chip support and a plurality of electronic parts arranged on the upside of the chip support; a probe unit distanced downward from the chip unit, the probe unit including a probe support and a plurality of contacts arranged on the underside of the probe support; a connection unit disposed between the chip unit and the probe unit so as to electrically connect them and including a pin support as well as a plurality of connection pins supported on said pin support so as to penetrate the pin support in an up-down direction; and a coupling unit separably coupling the chip unit, the probe unit and the connection unit and displacing at least either the chip unit or the probe unit in a direction to approach each other and to be away from each other relative to the connection unit.

The coupling unit may be provided with: a thrust bearing apparatus disposed in the one of the chip unit and the probe unit as well as in the pin support and coupling them displaceably in a direction to approach each other and to be away from each other, the bearing apparatus extending about an imaginary axis which extends in an up-down direction through the pin support and the probe support; a rotary ring disposed between the pin support and the bearing apparatus angularly rotatably about the imaginary axis; and a displacing mechanism for displacing the rotary ring about the imaginary axis and displacing the one of the chip unit and the probe unit and the pin support in a direction to approach each other and to be away from each other.

The displacing mechanism may be provided with: a cam follower extending from the one of the chip unit and the probe unit radially outward of an imaginary circle about the imaginary axis; a cam slot formed in the rotary ring and having an inlet portion for receiving the cam follower from the side of the one of the chip unit and the probe unit and a cam portion communicated to the inlet portion and extending about the imaginary axis from the inlet portion; and a drive mechanism for displacing the rotary ring about the imaginary axis relative to the connection unit, the cam portion having a cam surface inclined to the one of the chip unit and the probe unit such that a portion distal to the side of the inlet portion becomes closer to the side of either the chip unit or the probe unit.

The cam surface may have recesses concave on the one side and the opposite side of the chip unit and the probe unit at intervals about the imaginary axis, respectively, at plural portions.

The bearing apparatus may include: a bearing holder coupled with the one of the chip unit and the probe unit and with the pin support; and an annular thrust bearing which is disposed between the one of the chip unit and the probe unit and the bearing holder and with which the rotary ring is coupled.

The bearing holder can be coupled with the chip unit or the probe unit so as to be relatively displaceable in an up-down direction and not relatively displaceable about an imaginary axis extending in an up-down direction through the chip support, the pin support and the probe support.

The coupling unit may further include: a second bearing apparatus disposed between the other of the chip unit and the probe unit and the connection unit and extending about the imaginary axis; a second rotary ring disposed between the connection unit and the second bearing apparatus; and a second displacing mechanism which displaces the second rotary ring about the imaginary axis relative to the connection unit and which displaces the other of the chip unit and the probe unit as well as the connection unit in a direction to approach each other and apart from each other.

The chip support may include: a disk-shaped chip base plate having the electronic parts arranged on the upside; and a first ring having a first opening in which the chip base plate is disposed. The probe support may include: a disk-shaped probe base plate having the contacts arranged on the underside; and a second ring having a second opening in which the probe base plate is disposed. The pin support may include: a plate-like pin holder in which the connection pins are disposed to penetrate in an up-down direction; and a third ring having a third opening in which the pin holder is disposed. The coupling unit can couple the first, second and third rings displaceably in a direction to approach one another and to be apart from one another.

The pin support may include: a ring portion extending about an imaginary axis which extends in an up-down direction through the chip support, the pin support and the probe support as well as a plurality of linear portions extending toward the imaginary axis from the ring portion and mutually coupled in the central portion of the ring portion; and a pin holder formed by a plurality of fan-shaped plate-like pin support pieces arranged in each space formed by the ring portion and the adjoining linear portions, the respective pin support pieces holding the plural connection pins.

Each connection pin may include: a main body portion penetrating the pin holder in an up-down direction; an upper tip portion integrally continuing to the upper end of the main body portion and projecting upward from the pin holder; and a lower tip portion integrally continuing to the lower end of the main body portion and projecting downward from the pin holder.

Each connection pin may include: a pair of pin members spaced apart from each other in an up-down direction; and a pogo pin having a spring member which is disposed between both the pin members so as to energize both pin members so that their front end portions may project from the pin support rearward and downward, respectively. The pin support may further include an electrically insulating sheet member disposed on each of the upper and lower surfaces of the pin holder and having a hole to permit the front end portions of the pin members to project from the sheet member.

The testing apparatus may further comprise a support base for supporting the outer rim portion of the pin support.

Each of electronic parts may include accumulated test chips which generate an electrical signal for use in an electrical test of a device under test and process upon receipt of a response signal from the device under test.

In the testing apparatus of the present invention, a relative pressing force between at least one of the chip unit and the probe unit and the connection pin changes when one of the chip support and the probe support and the pin support are displaced in a direction to approach each other and to be apart from each other by the coupling unit.

Thus, according to the present invention, the relative pressing force between at least one of the chip unit and the probe unit and the connection pin can be adjusted by displacing at least one of the chip unit and the probe unit and the connection unit in a direction to approach each other and to be apart from each other.

BRIEF DESCRIPTION OF THE DRAWINGS

FIG. 6 is an exploded vertical sectional view showing main composing elements of the card assembly.

DETAILED DESCRIPTION

Figure 1:
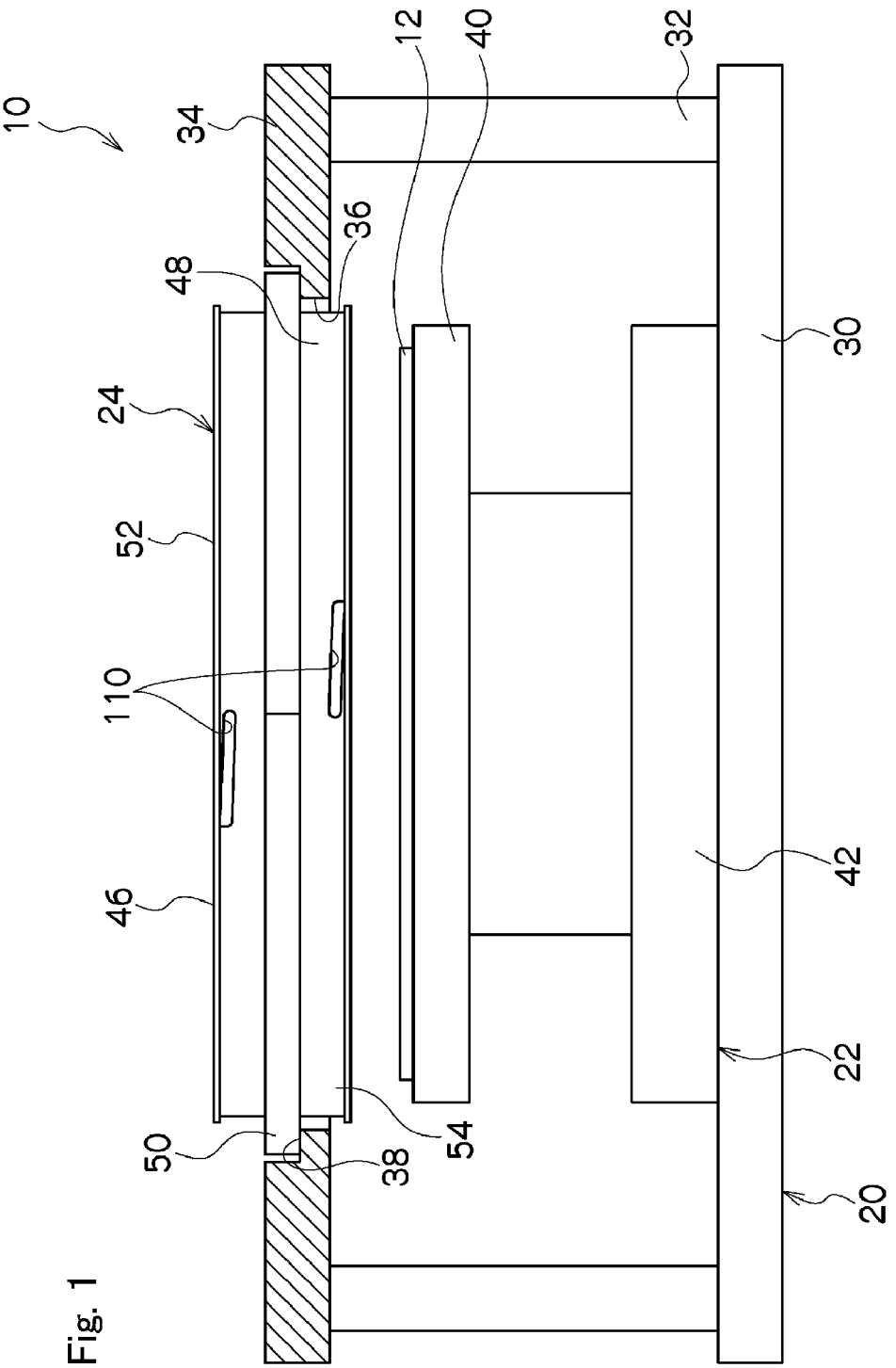
FIG. 1 is a front view showing an embodiment of an apparatus for testing an integrated circuit according to the present invention.
Figure 2:
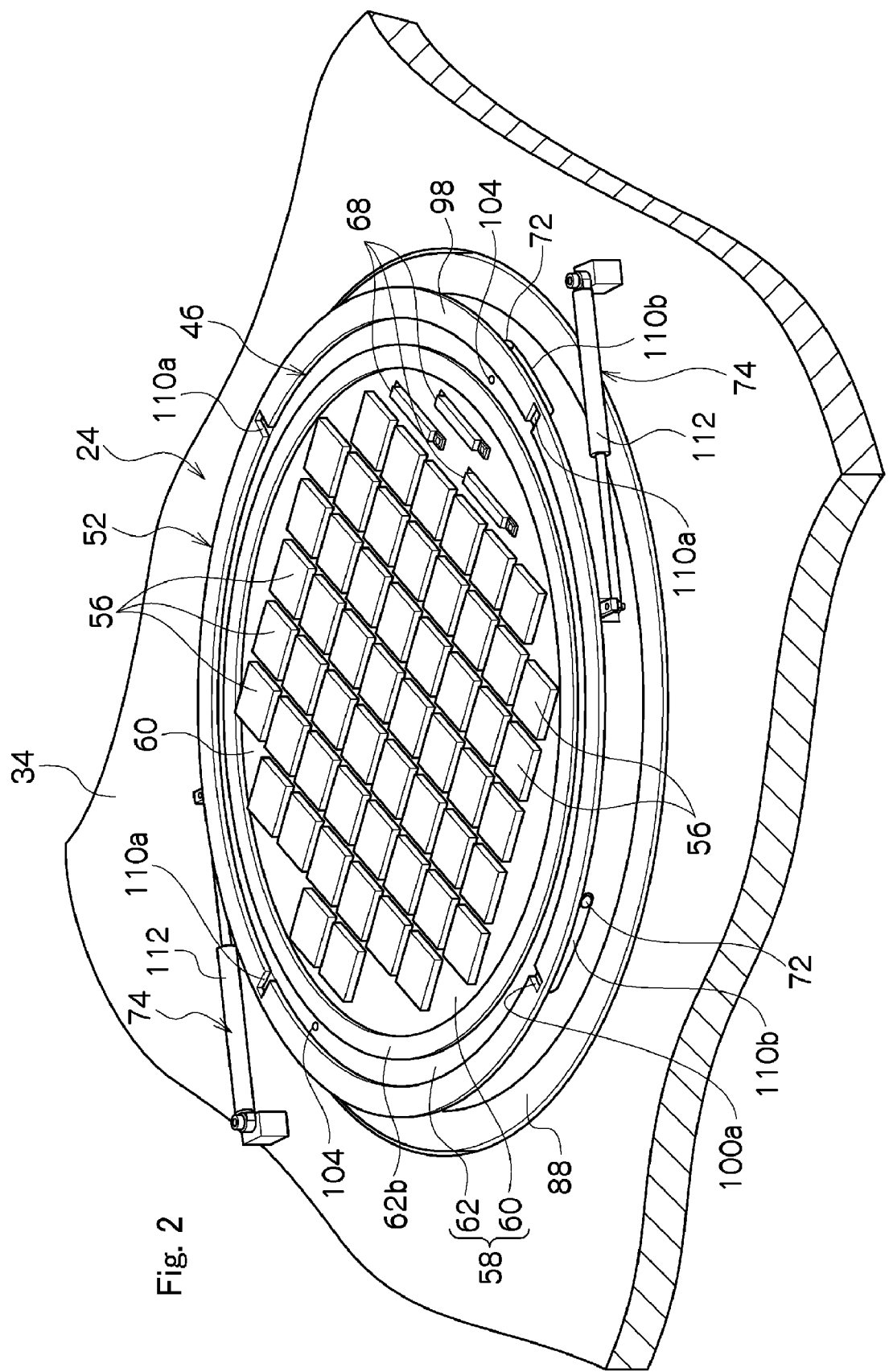
FIG. 2 is a perspective view in which a card assembly and its surrounding to be used in the testing apparatus shown in FIG. 1 are seen from obliquely above.
Figure 3:
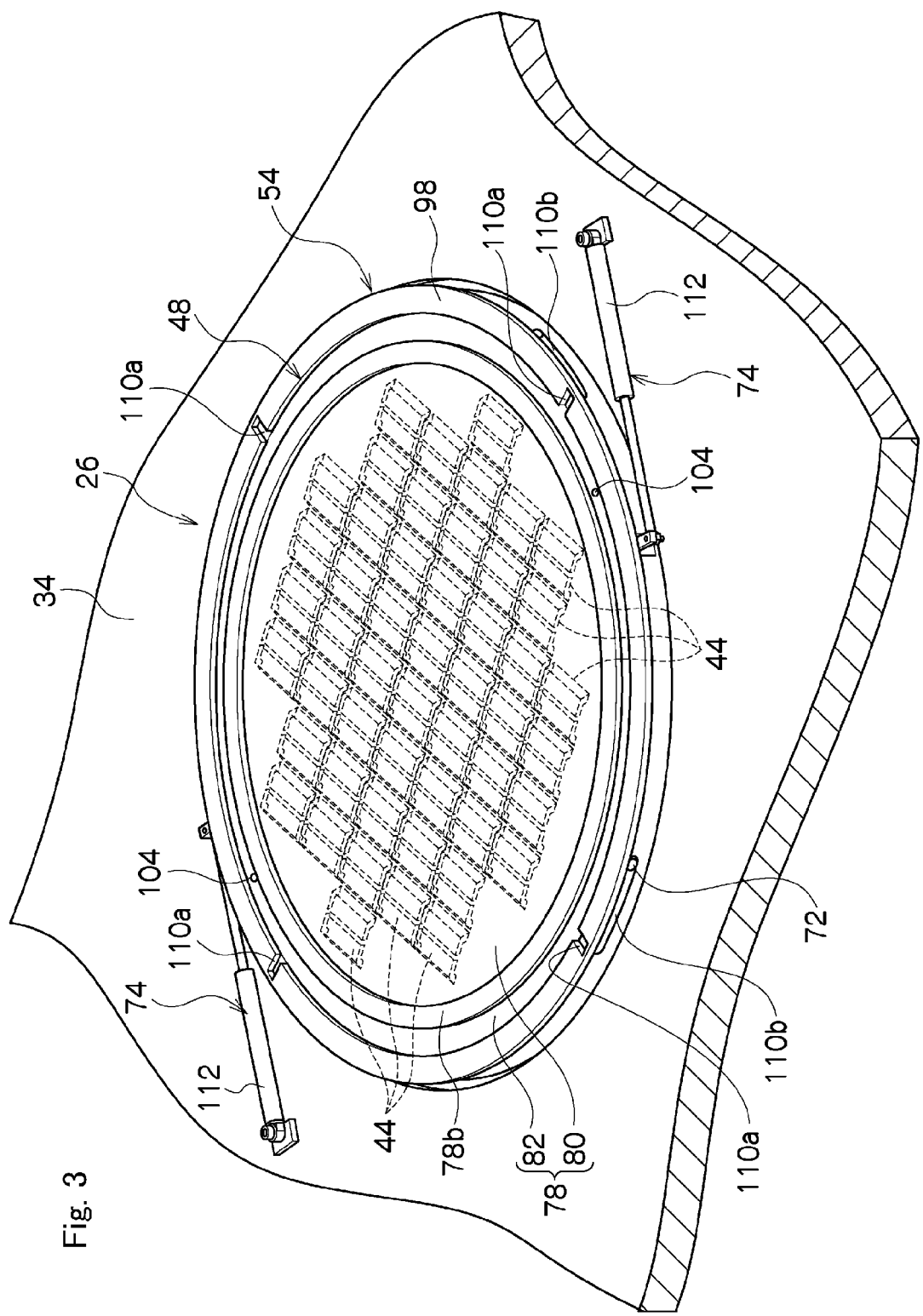
FIG. 3 is a perspective view in which the card assembly and its surrounding are seen from obliquely below.
Figure 4:
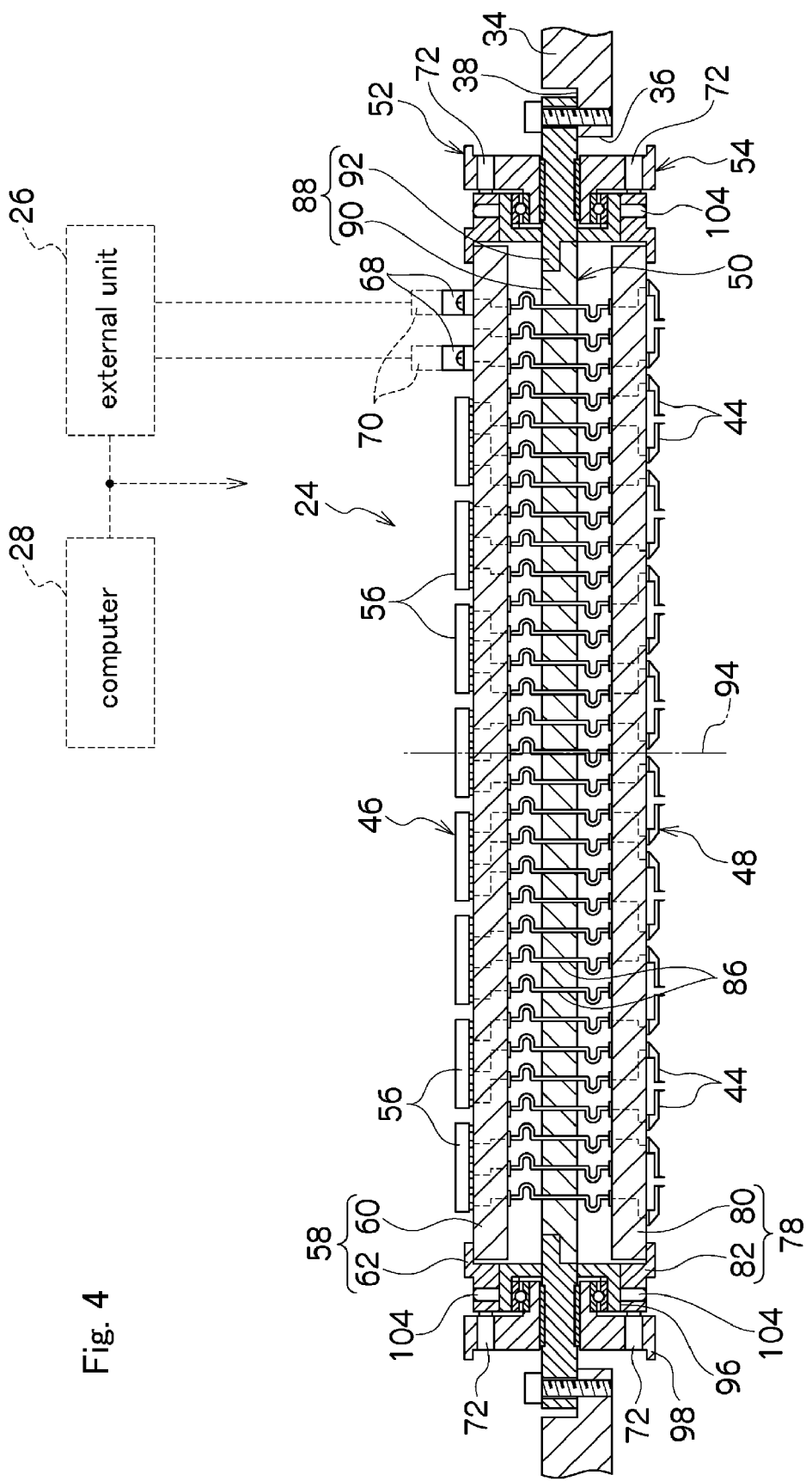
FIG. 4 is a vertical cross-sectional view of the card assembly and its surrounding.
Figure 5:
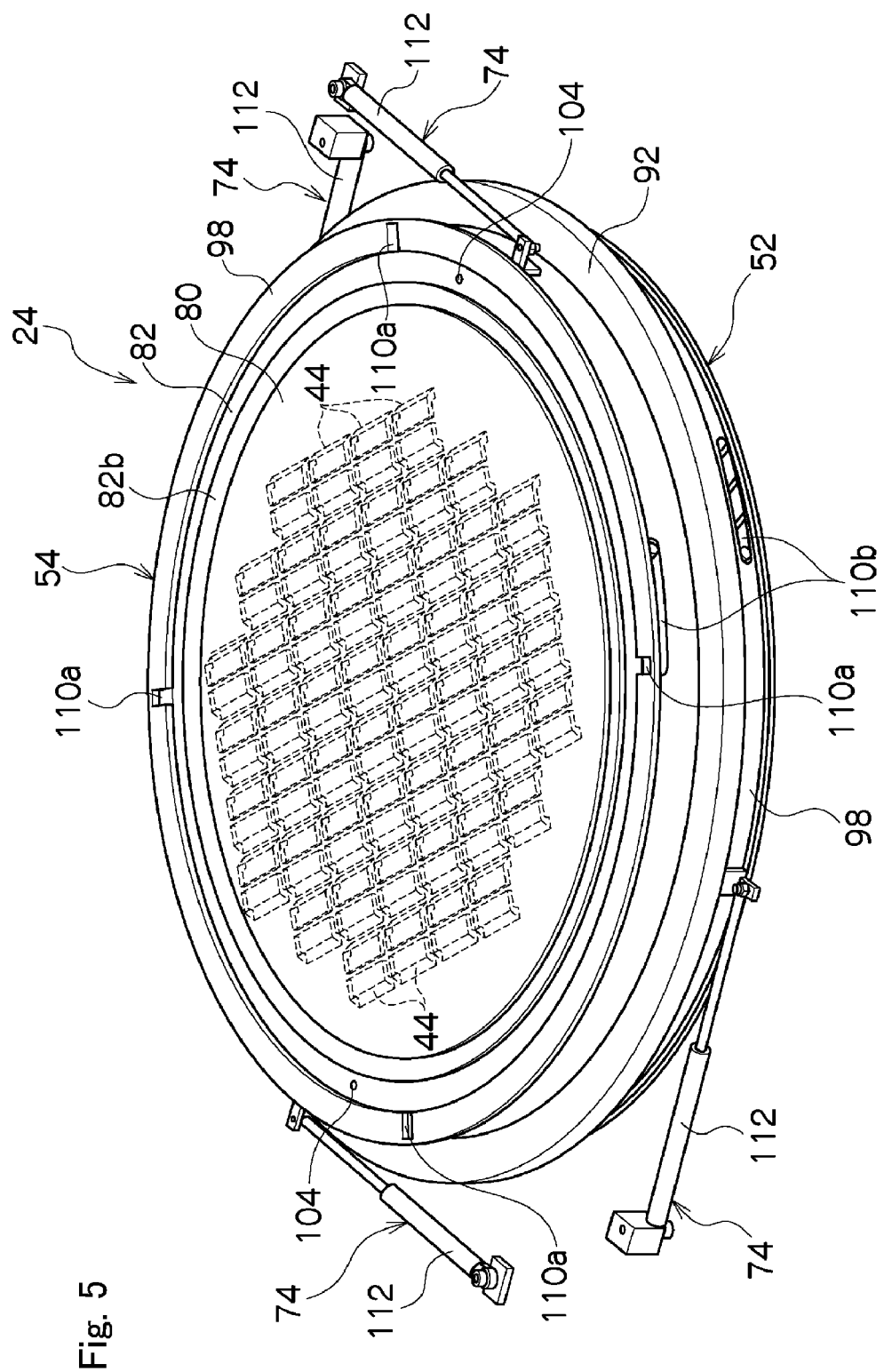
FIG. 5 is a perspective view in which the card assembly is seen from obliquely below.
Figure 7:
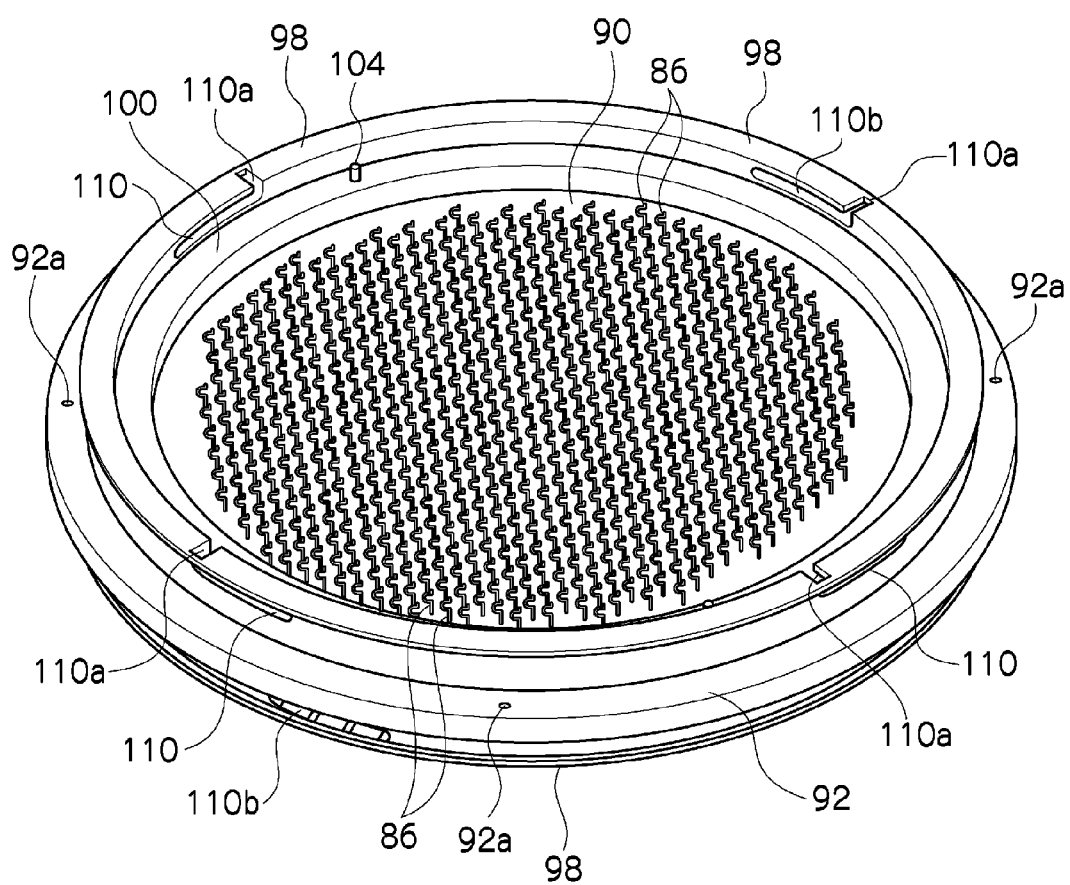
FIG. 7 is a perspective view in which the card assembly, with the chip unit removed, is seen from obliquely above.
Figure 8:
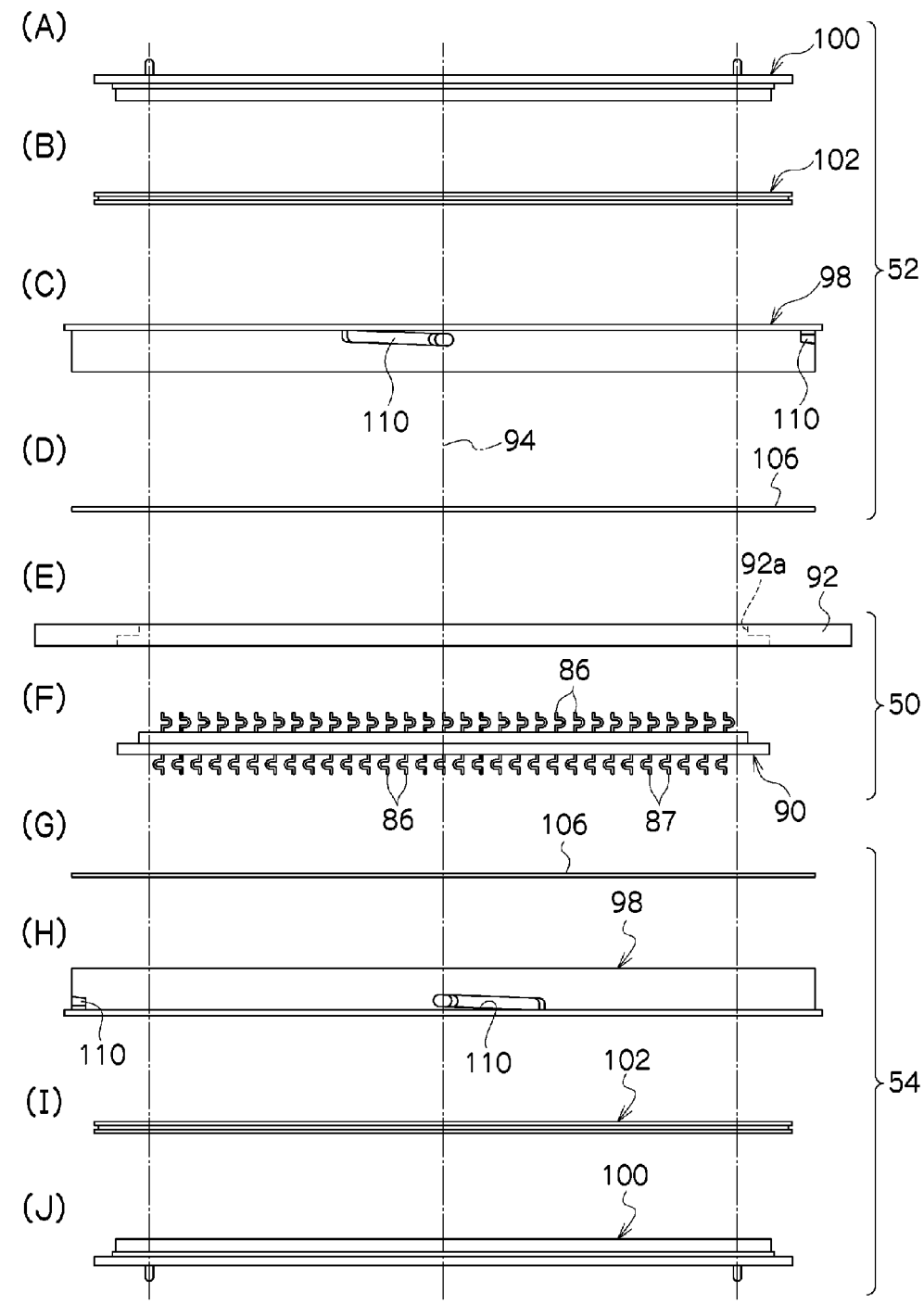
FIG. 8 is an exploded front view showing the connection unit and the coupling unit to be used in the card assembly.
Figure 9:
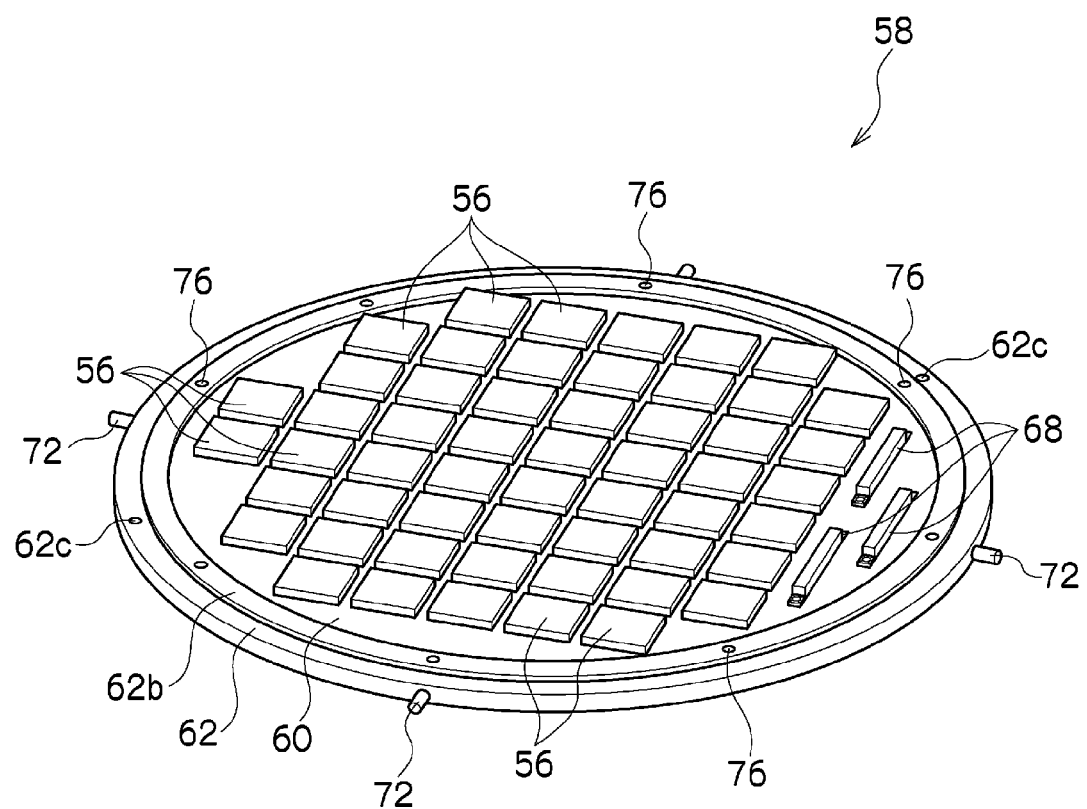
FIG. 9 is a perspective view in which the chip support to be used in the card assembly is seen from obliquely above.
Figure 10:
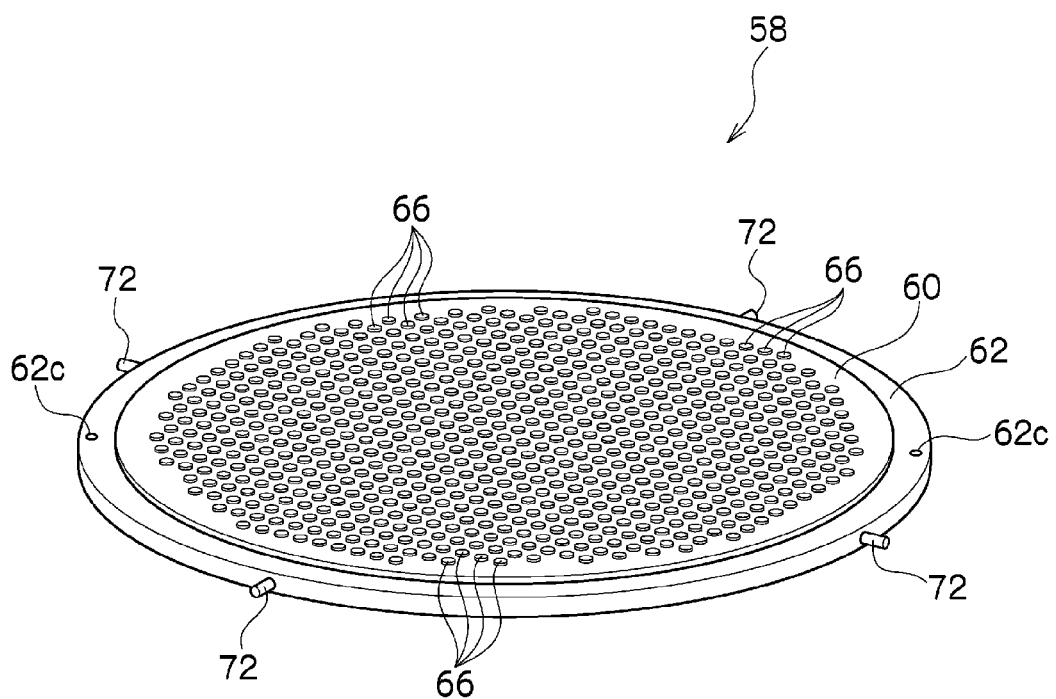
FIG. 10 is a perspective view in which the chip support is seen from obliquely below.
Figure 11:
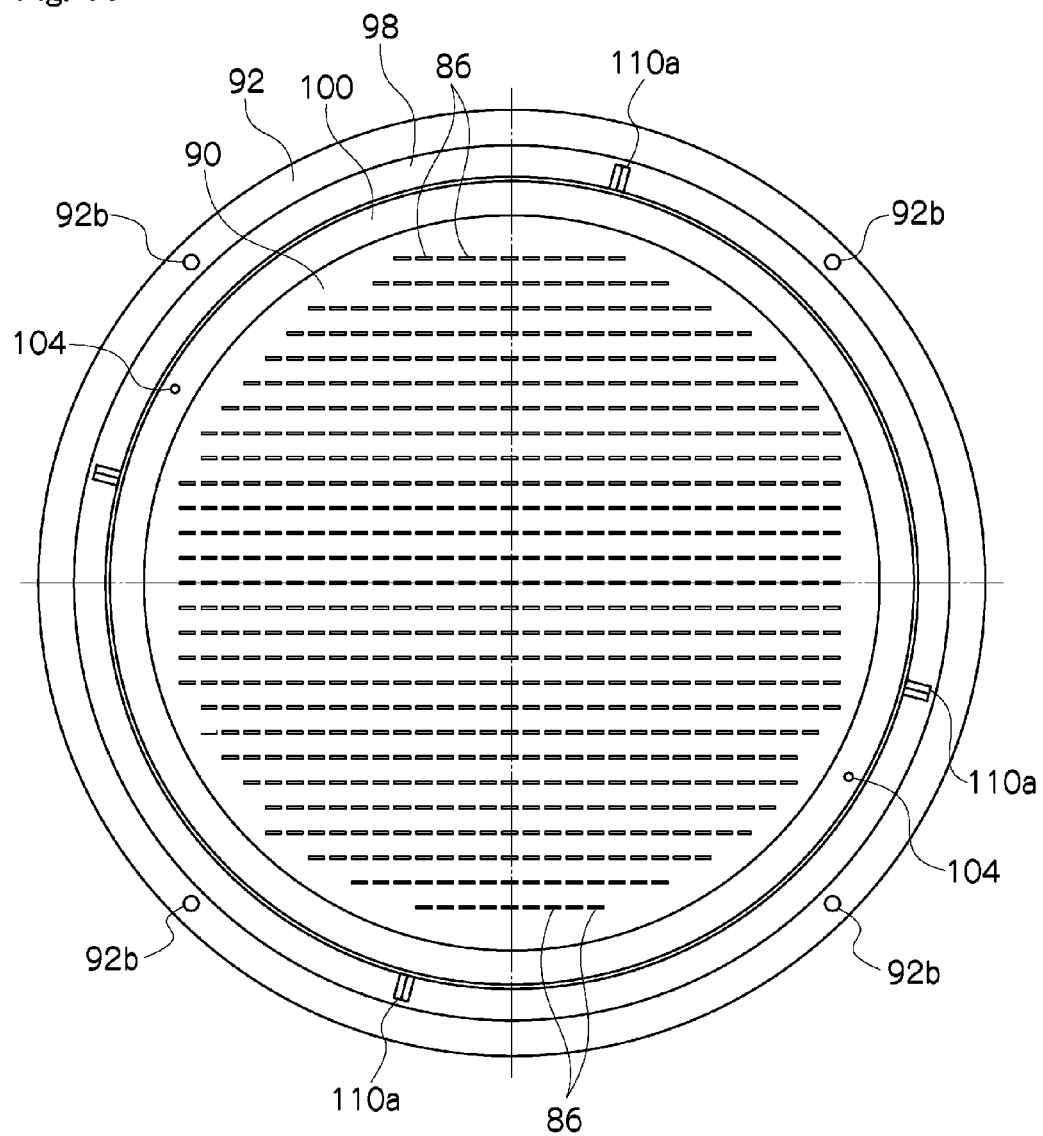
FIG. 11 is a plan view showing the connection unit and its surrounding, with the chip unit removed.

In FIGS. 1 and 4, an up-down direction is referred to as a vertical direction or a Z direction; a right-left direction is referred to as a right-left direction or an X direction; and a direction perpendicular to the drawing sheet is referred to as a front-back direction of a Y direction. However, these directions differ with the postures of a chip unit, a probe unit and a connection unit when they are mounted on a frame of a testing apparatus.

Accordingly, the testing apparatus may be used, in a state where those three units are mounted on the frame, regardless of a state where the up-down direction in the present invention becomes actually an up-down direction or vice versa, an inclined state or the like.

Referring to FIG. 1, an embodiment of a testing apparatus 10 inspects or tests a plurality of uncut integrated circuits (not shown) formed in a disk-shaped semiconductor wafer 12 as a device under test at one time or in several batches. Each integrated circuit to undergo an electrical test by the testing apparatus 10 has a plurality of electrodes (not shown) such as pad electrodes on the upside as well as a plurality of cells.

The testing apparatus 10 comprises: a support unit 20; an inspection stage 22 supported on the support unit 20 and receiving a wafer 12; a card assembly 24 supported on the support unit 20 so as to be positioned above the stage 20 and receiving and delivering electrical signals with the wafer 12; an external unit 26 (see FIGS. 4 and 16) provided with various electric circuits; and a computer 28 (see FIGS. 4 and 16) for controlling each circuit and equipment of the testing apparatus 10 and processing signals.

The support unit 20 is provided with: a base plate 30 extending in the XY directions; a columnar support 32 attached to the upper end portion of each columnar support 32 so as to extend upward from each of plural positions at intervals in the XY directions of the base plate to extend upward.

The support base 34 has a circular opening 36 for receiving the card assembly 24. A rim portion around the opening 36 and defining the opening 36 is made to be an upward stage portion 38 which supports the card assembly 24 (see FIGS. 1, 4 and 12).

The inspection stage 22 is a known mechanism which has a chuck top 40 releasably adsorbing the wafer 12 supported vacuum-wise on an upper portion of a stage moving mechanism 42 and moves the chuck top 40 three-dimensionally in the X, Y and Z directions by the stage moving mechanism 42 and rotates angularly about the Z axis (e.g., the imaginary axis 94 in FIG. 4) extending in an up-down direction.

Thus, the wafer 12 is moved three-dimensionally in a front-back, right-left and up-down directions in a state of being adsorbed on the inspection stage 22 vacuum-wise and releasably, and rotated angularly about the Z axis, thereby positioning each electrode of the integrated circuit so as to be able to contact the tip of the plate-like contact 44.

The card assembly 24 includes: a disk-shaped parts unit, i.e., a chip unit 46; a probe unit 48 provided with a plurality of the contacts 44; a connection unit 50 for electrically connecting the internal wirings of both those units 46, 48; an upper coupling unit 52 (see FIGS. 2-15) for separably coupling the units 46 and 50; and a lower coupling unit 54 (see FIGS. 2-15) for separably coupling the units 48 and 50, and has a generally disk-like shape.

In the following is given a further explanation about the details of the above-mentioned card assembly 24 with reference to FIGS. 2-17.

Figure 12:
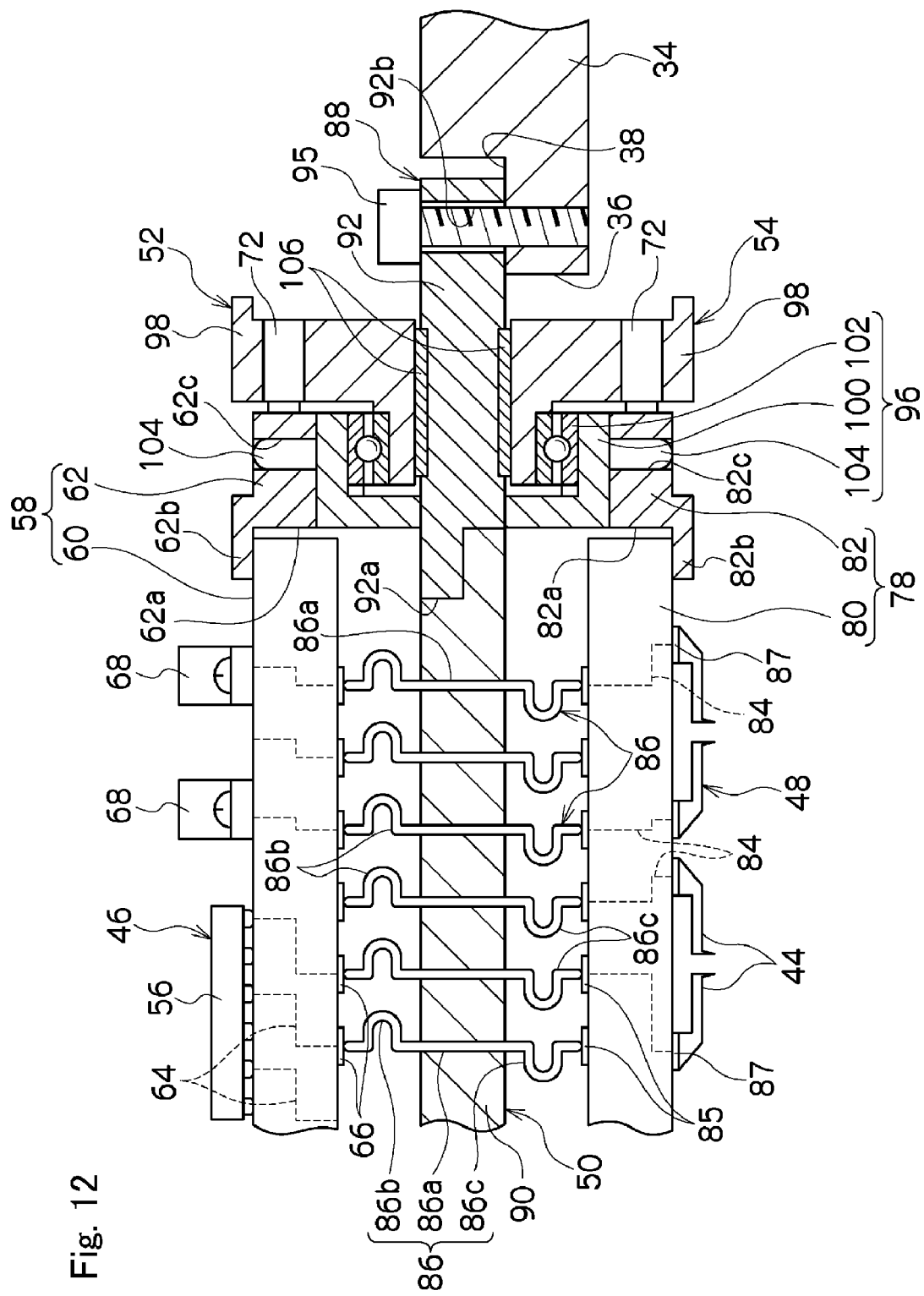
FIG. 12 is an enlarged sectional view of the coupling portion and its surrounding members of the card assembly.

As shown in detail in FIG. 12, the chip unit 46 has a plurality (M) of test chips 56, respectively, acting as electronic parts arranged on the upside of the disk-shaped chip support 58. Each test chip 56 is made to correspond to a plurality (N) of devices under test (integrated circuits).

Each test chip 56 is an integrated circuit chip formed by cutting the integrated circuit formed in the semiconductor wafer so as to generate an electric signal to be used in an electrical test of each corresponding device under test, and to process upon receipt of a response signal from the corresponding device under test, and carries out an electrical test of each corresponding device under test.

The chip support 58 has a disk-shaped chip base plate 60 with a plurality of test chips 56 arranged on the upside and a ring 62 extending around the chip base plate 60. The ring 62 also receives the chip base plate 60 in the opening 62a (see FIGS. 6 and 12) of the ring 62 such that the upside and underside of the chip base plate are respectively exposed.

Such a chip base plate 60 is a multi-layer wiring board made of an electrically insulating material such as a resin like glass-epoxy or polyimide, ceramic, their laminates into a disk-like shape, and has a plurality of internal wirings 64, and further, has multiple connection lands (not shown) connected to the electrodes of the test chip 56 on the upside as well as other multiple connection lands 66 on the underside, and further, a plurality of connectors 68 on the upside.

Among multiple internal wirings 64, the upper end portions thereof are connected to the connection land (not shown) which is connected to the electrode of the test chip 56, while the upper end portions of the remaining plural internal wirings 64 are connected to the terminals of the connectors 68. The end portion of each internal wiring 64 is connected to the connection land 66. Each connector 68 is coupled with the other connector 70 which is to be electrically connected to the external unit 26, the computer 28 and the like.

The ring 62 is a plate-like ring and has in the inside of the upper end an inward flange portion 62b projecting inward from the upper end portion as well as a positioning hole 62c penetrating in the up-down direction at each of plural positions at intervals in the circumferential direction.

The chip base plate 60 and the ring 62 are separably coupled with a plurality of setscrews 76 (see FIG. 9) penetrating the flange portion 62b downward from above and screwed into the chip base plate 60 such that the chip base plate 60 is pressed by the underside of the flange portion 62b and that the ring 62 extends coaxially around the chip base plate 60.

A plurality of cam followers 72 are provided in the ring 62 at intervals about an imaginary axis 94 shown in FIG. 4. The cam followers 72 of the ring 62 extend from the outer circumferential portion of the ring radially outward to act as a part of a displacing mechanism 74 (see FIGS. 2, 3, 4 and 14) in the upper coupling unit 52.

As shown in detail in FIG. 12, the probe unit 48 is provided with a plurality of contacts 44 and a disk-shaped probe support 78, the contacts 44 being disposed on the underside of the probe support 78. The probe support 78 is provided with a disk-shaped probe base plate 80 with the plurality of contacts 44 arranged on the underside thereof and a ring 82 extending around the probe base plate 80. Further, the ring 82 receives the probe base plate 80 in an opening 82a (see FIGS. 6 and 12) such that the upside and the underside of the probe base plate are exposed, respectively, upward and downward.

Such a probe base plate 80 is a disk-shaped wiring board made of an electrically insulating material such as, like the chip base plate 60, a resin such as glass-epoxy and polyimide, ceramic, their laminates, and has approximately the same diameter as that of the chip base plate 60, with multiple internal wirings 84 and a plurality of connection lands 85 on the upside, and in addition, a plurality of probe lands 87 on the underside.

Each contact 44 is a publicly known one provided with a seat portion (mounting area) extending in the up-down, an arm area extending from the lower end portion of the seat portion in the X direction or the Y direction, and a tip area projecting downward from the front end portion of the arm area, as described in Japanese Patent Appln. Public Disclosure No. 2006-337080 Official Gazette, Japanese Patent Appln. Public Disclosure No. 2007-113946 Official Gazette, Japanese Patent Appln. Public Disclosure No. 2009-115477 Official Gazette and the like, which are incorporated herein by reference.

Each contact 44 is secured to the probe land 87 at the upper end portion of the seat portion in a cantilevered state by soldering, welding and other arbitrary methods such that the arm area extends in the X direction or the Y direction, while the tip area projects downward. The upper end portion and the lower end portion of each internal wiring 84 are connected, respectively, to the connection land 85 and the probe land 87.

The ring 82 is a plate-like ring, like the ring 62, and has in the inside of the lower end an inward flange portion 82b projecting inward from the lower end portion as well as vertically penetrating positioning holes 82c at intervals in the circumferential direction, respectively, at plural positions.

The probe base plate 80 and the ring 82, like the coupling of the chip base plate 60 and the ring 62, penetrating the flange portion 82b upward from below, are separably coupled with a plurality of setscrews (not shown) such that the probe base plate 80 is pressed against the upside of the flange portion 82b and that the ring 82 is coaxially extended around the probe base plate 80.

Like the ring 62, a plurality of cam followers 72 are attached to the ring 82 at intervals around the imaginary axis 94 shown in FIG. 4. The cam followers 72 of the ring 82 are extended radially outward from the outer rim portion of the ring 82 and act as a part of the displacing mechanism 74 in the lower coupling unit 54.

As shown in detail in FIG. 12, the connection unit 50 has multiple connection pins 86 for electrically connecting the connection lands 66 and 85, and a disk-shaped pin support 88 for supporting the connection pins. The pin support 88 has a pin holder 90 and a plate-like ring 92 for receiving the pin holder 90. The pin holder 90 supports the connection pins 86 such that the connection pins 86 vertically penetrate the disk-shaped pin holder 90. The ring 92 receives the pin holder 90 in an opening 92a.

Each of the pin holder 90 and the ring 92 has an upward stage portion and a downward stage portion in the outer rim portion, and the stage portions are separably coupled with a plurality of setscrews (not shown) so as to be pressed against each other and positioned coaxially around the pin holder 90.

Figure 13:
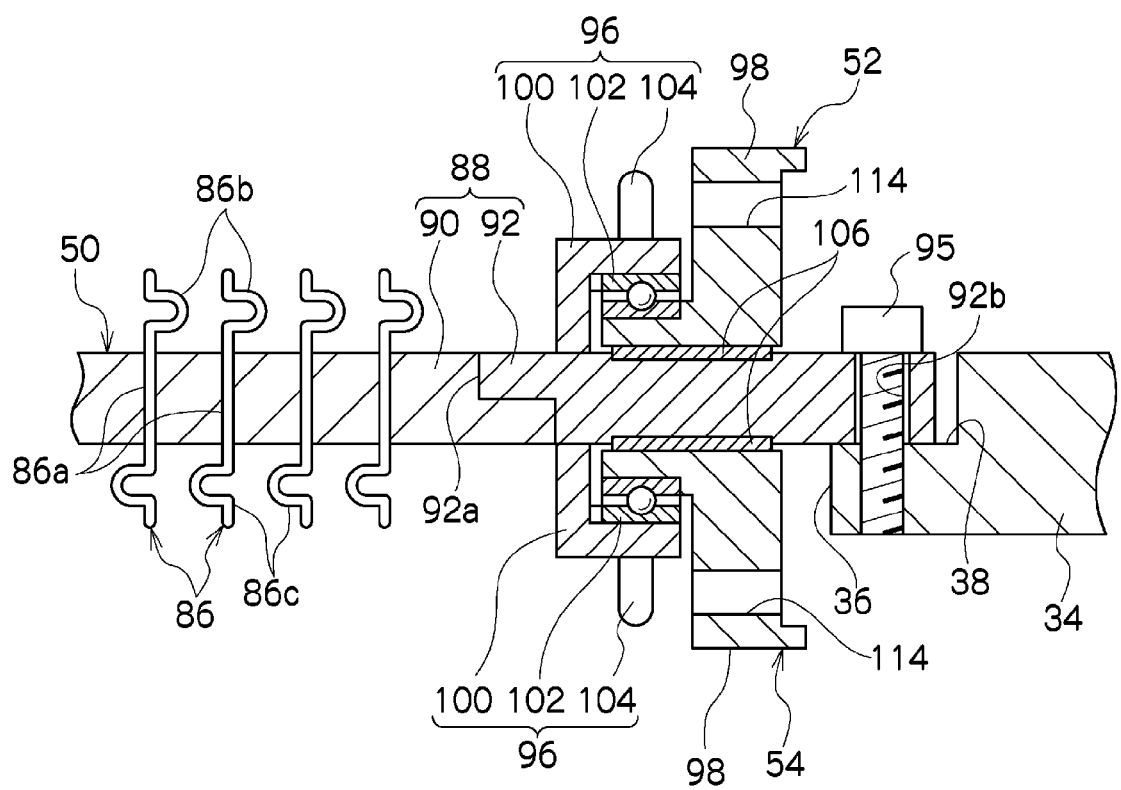
FIG. 13 is an enlarged sectional view showing the connection unit in FIG. 12 and the upper and lower coupling units together with their surrounding members.

Each connection pin 86 is made of an electrically conductive material into a thin wire-like or plate-like shape, and has a main portion 86a which penetrates a pin holder 90 in its thickness direction, a laterally-facing U-shaped upper tip portion 86b which integrally continues to the upper portion of the main portion 86a, and a laterally-facing U-shaped lower tip portion 86c which integrally continues to the lower portion of the main portion 86a (see FIGS. 12 and 13). The upper end portion of the upper tip portion 86b and the lower end portion of the lower tip portion 86c are, respectively, projected upward and downward from the pin holder 90.

The chip support 58, the probe support 78, and the pin support 88 are coaxially coupled by the coupling units 52 and 54 with the vertically extending imaginary axis 94 (see FIG. 4) as a common axis.

As shown in detail in FIG. 12, the connection unit 50 is separably coupled with the support base 34 such that the rim portion of the ring 92 is mounted on the upward stage portion 38 of the support base 34 by passing a plurality of screw members 95 through the though hole 92b of the ring 92 and screwing into the support base 34. Thus, the card assembly 24 is supported at the support unit 20.

As shown in FIGS. 12 and 13 in detail, each of the coupling units 52 and 54 includes, in addition to the plural displacing units 74, a thrust bearing apparatus 96 and a rotary ring 98 disposed between the pin support 88 and the thrust bearing apparatus 96 and coupled with the thrust bearing apparatus 96 from the rim side.

The thrust bearing apparatus 96 has an annular bearing holder 100 extending about the imaginary axis 94, a thrust bearing 102 extending about the imaginary axis 94, and a positioning pin 104. The bearing holder 100 is disposed between the chip support 58 or the probe support 78 and the pin support 88 (particularly, the ring 92), and the thrust bearing 102 is disposed between the rotary ring 98 and the bearing holder 100, and the positioning pins 104 are provided at plural positions at intervals in the circumferential direction of the upside or the underside of the bearing holder 100.

Each bearing holder 100 is attached to the upside or the underside of the ring 92 so as not to move relatively. The positioning pin 104 is projected upward or downward from each bearing holder 100 and received in the positioning hole 62c or 82c. Thus, the chip support 58 and the ring 92 as well as the probe support 78 and the ring 92 are coupled so as to be relatively displaceable and not to be relatively displaced about the imaginary axis.

Each bearing holder 100 has an L-shaped or an inverted L-shaped sectional configuration by a short cylindrical portion which extends upward or downward from the upside or the underside of the ring 92 and attached to the ring 92 not to relatively move by appropriate means such as a screw member (not shown), and a plate ring portion extending outward from the upper end of the cylindrical portion. The thrust bearing 102 is attached to the underside or the upside of the plate ring portion of the bearing holder 100 in an annular orbital board (thrust ring) the upside or the underside.

Each rotary ring 98 is L-shaped or inverted L-shaped by the plate ring portion partially coupled with the thrust bearing 102 and a short cylindrical portion extending upward or downward from the outer rim portion of the ring portion, and is attached to an annular trajectory board (thrust ring) of the underside or upside of the ring portion. Thus, each rotary ring 98 is assembled rotatably about the imaginary axis 94 shown in FIG. 4 relative to the three units 46, 48 and 50 (see FIGS. 1, 2 and 6).

In order to smooth the movement of the rotary ring 98 relative to the ring 92, an annular slide sheet 106 is disposed between the ring 92 and the rotary ring 98.

Figure 14:
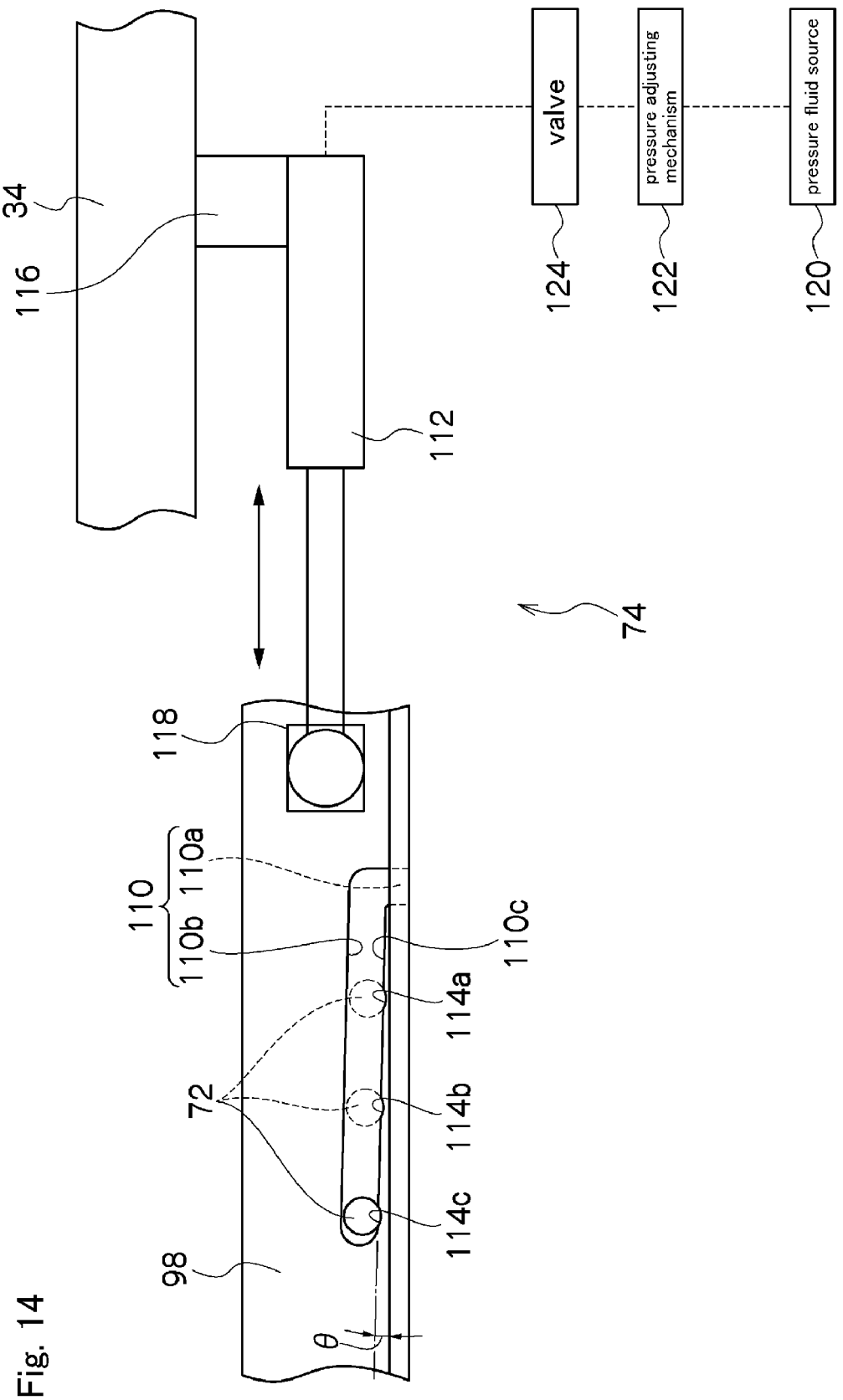
FIG. 14 is a front view showing an embodiment of the displacing mechanism in a developed state together with a fluid circuit.
Figure 15:
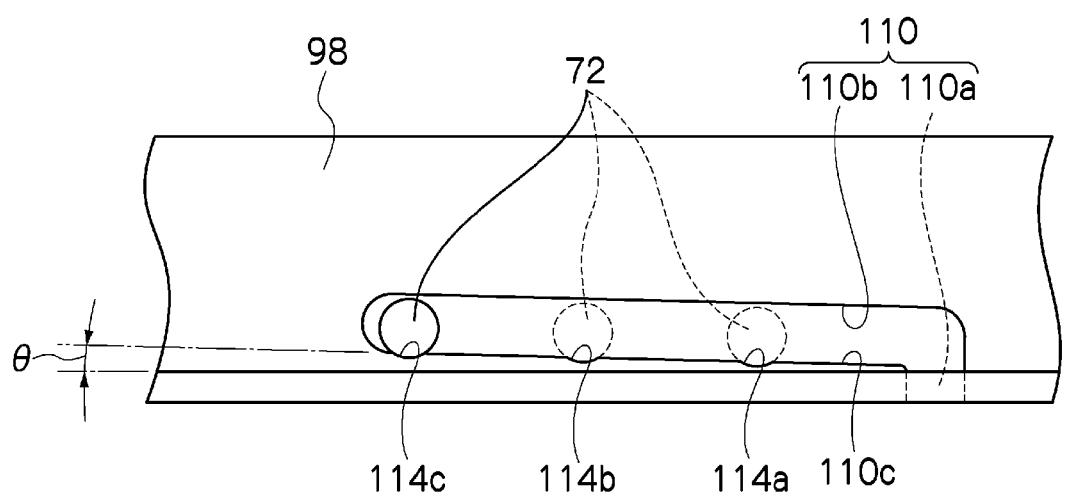
FIG. 15 is an enlarged front view of a pressing force adjusting portion of the displacing mechanism shown in FIG. 14.

FIGS. 14 and 15 show an embodiment of a lower (on the probe unit 48 side) displacing mechanism. The upper (on the chip unit 46 side) displacing mechanism 74 has inverted configurations and structures of plural cam followers 72, plural cam slots 110, plural drive mechanisms 112 and the like in FIGS. 14 and 15 which constitute each displacing mechanism.

As shown in detail in FIGS. 14 and 15, the plurality of cam slots 110 are formed at intervals about the imaginary axis 94 shown in FIG. 4 in the rotary ring 98 so as to receive the cam followers 72, and the plurality of drive mechanisms 112 are provided at intervals about the imaginary axis 94 shown in FIG. 4 so as to displace the rotary ring 98 about the imaginary axis 94 relative to the support 88.

Each cam slot 110 has an inlet 110a for receiving the cam follower 72, and a cam portion 110b communicated to the inlet 110a and extending from the inlet 110a about the imaginary axis 94.

The inlet 110a is open upward or downward so as to receive the corresponding cam follower 72 from the side (i.e., either the upper side or lower side) of the probe support 78 (or the chip support 58).

The cam portion 110b has a cam surface 110c which is inclined by an angle $\theta$ to the probe support 78 (or the chip support 58) such that a portion distal to the side of the inlet portion 110a becomes closer to the chip support 58 or the probe support 78 side (i.e., upward or downward).

The cam surface 110c, of the faces defining the cam portion 110b, is a surface opposing the pin support 88 side, and has a plurality of recesses 114a, 114b and 114c concave toward the side opposite to the pin support 88 side. The recesses 114a, 114b and 114c are spaced apart about the imaginary axis 94.

In the example shown in FIG. 14, each drive mechanism 112 uses a plurality of cylinder mechanisms, in which a piston portion is connected to the rotary ring 98 by a fitting 118 and a cylinder portion is connected to the support base 34 by a fitting 116.

Compressed fluid, such as compressed air and compressed oil, is supplied simultaneously to those drive mechanisms 112 (i.e., cylinder mechanisms) through a pressure fluid source 120, a pressure adjusting mechanism 122, and a valve 124. The pressure fluid source 120, pressure adjusting mechanism 122, and valve 124 are controlled by the computer 28 shown in FIG. 4.

When the pressure fluid is supplied to one cylinder chamber relative to the piston, each drive mechanism 112 is moved in an extending direction and rotates to move the rotary ring 98 in one direction about the imaginary axis 94, and when the pressure fluid is supplied to the other cylinder chamber relative to the piston, the piston is moved in a contracting direction to rotate and move the rotary ring 98 in the other direction about the imaginary axis 94.

Thus, in addition to the fact that the chip unit 46, probe unit 48 and connection unit 50 are displaceably coupled with one another and with the bearing holder 100, the cam portion 110b is moved about the imaginary axis 94 relative to the cam follower 72.

As a result, the chip unit 46 or the probe unit 48 is moved in a direction to approach the connection unit 50 or to be apart therefrom, thereby changing the relative pressing force between the connection land 66 or 85 and the connection pin 86.

The rotary ring 98, eventually, the cam portion 110b is rotated to move relative to the cam follower 72, whereby the rotary ring 98, eventually, the cam portion 110b is held by the drive mechanism 112 in a state that the cam follower 72 is received in any one of the recesses 114a, 114b, and 114c. Thus, the relative pressing force of the connection land 66 or 85 and the connection pin 86 is maintained at a value corresponding to the recesses 114a, 114b or 114c in which the cam follower 72 is received.

The distance dimensions from the chip unit 46 or the probe unit 48 to the recesses 114a, 114b and, 114c is smaller in the order to the recesses 114a, 114b and 114c. Therefore, when the cam follower 72 is received in the recess 114a, the relative pressing force of the connection land 66 or 85 and the connection pin 86 becomes minimum. On the other hand, when the cam follower 72 is received in the recess 114c, the relative pressing force of the connection land 66 or 85 and the connection pin 86 becomes maximum.

As a result, according to the coupling units 52 and 54, by displacing the cam follower 72 to an arbitrary position of the cam slot 110, it is possible to change or adjust the relative pressing force of the connection land 66 or 85 and the connection pin 86, without rotating the connection unit 54 relative to the chip unit 46 and probe unit 48.

Also, it is possible to prevent the relative pressing force of the connection land 66 or 85 and the connection pin 86 from changing when testing, by placing the cam follower 72 at any one of the recesses 114a, 114b and 114c.

However, when the friction force between the cam slot 110 and the cam follower 72 and the driving force or maintaining force of the drive mechanism are great, the recesses 114a, 114b and 114c may be omitted in the case of using another device for changing and maintaining the cam follower 72 to or at an arbitrary position within the cam follower 72.

When testing, the tip of the contact 44 is pressed against the corresponding electrode of a device under test, in which state a test signal is fed from each test chip 56 to the device under test, and a response signal from each device under test is outputted to the corresponding test chip 56. Each test chip 56 determines whether the cells in the device under test are good or not, based on the response signal from the corresponding device under test.

As mentioned above, there are advantages such as follows, if the relative pressing force of the connection lands 66 and 85 and the connection pin 86 can be changed or adjusted.

The relative pressing force of the connection land 66 and the connection pin 86 as well as the relative pressing force of the connection land 85 and the connection pin 86 can be changed or adjusted individually or to the same value according to the types of the devices under test. In addition, the relative pressing force of the connection lands 66, 85 and the connection pin 86 can be changed or adjusted according to the relative pressing force of the electrodes of the device under test and the contacts 44.

As a result, in a test of a device under test using a high-frequency signal of a weak current and a weak voltage such as an integrated circuit, it is possible to set contact resistance values at their contact sections at optimum values.

Embodiment of the Test Chip

Figure 16:
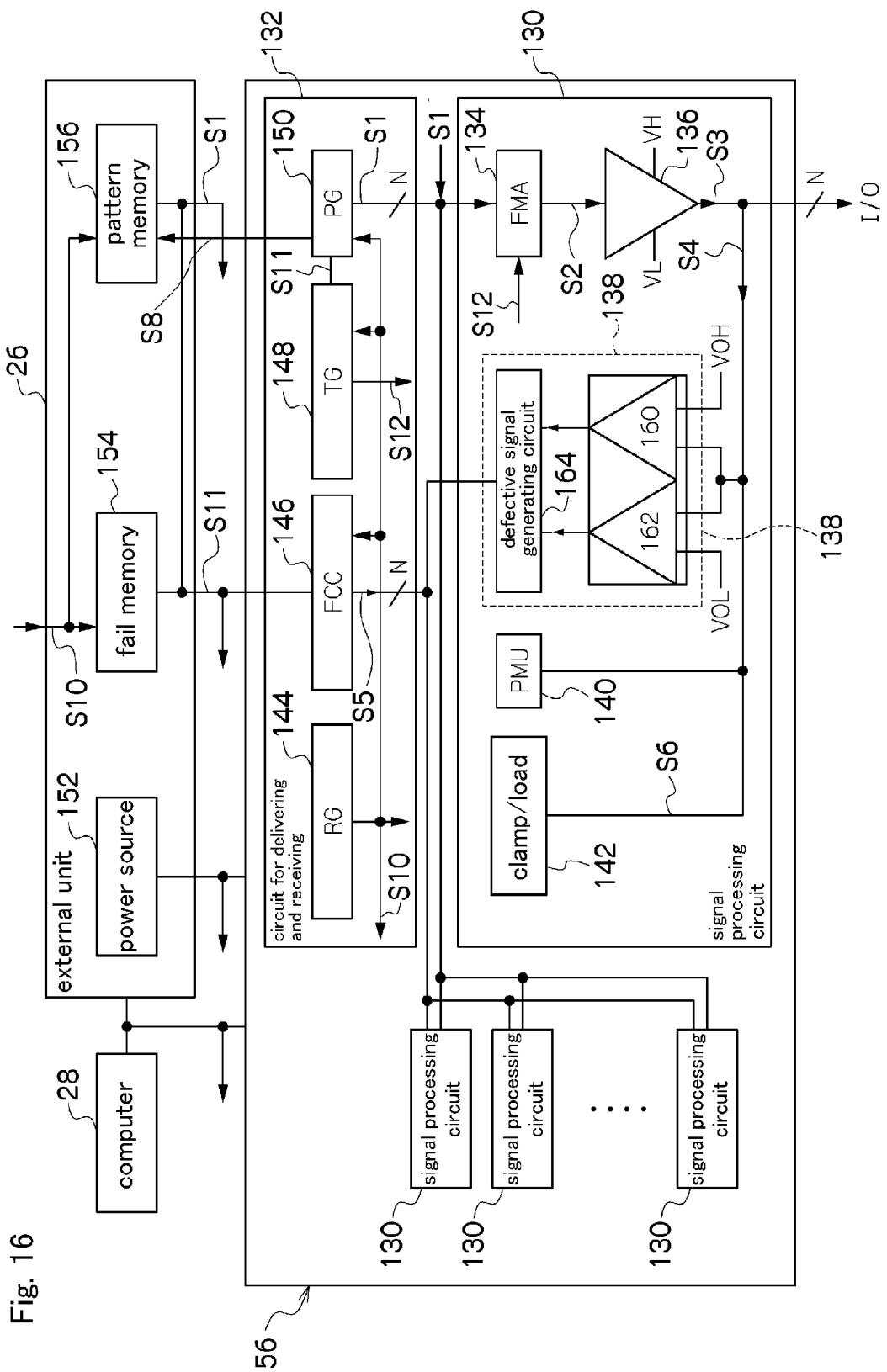
FIG. 16 is a circuit diagram for explaining one embodiment of a test chip to be used in the testing apparatus in FIG. 1.
Figure 17:
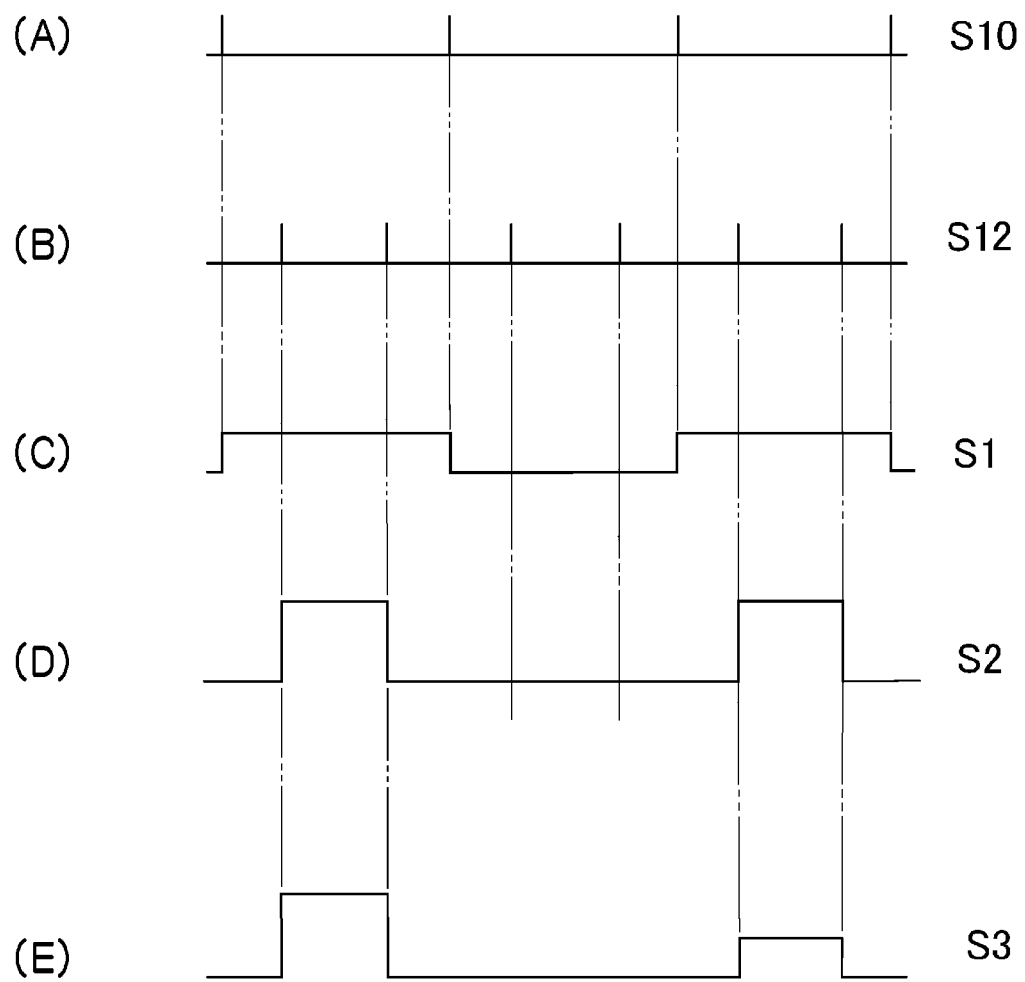
FIG. 17 is a view showing a waveform of an electrical signal in the test chip of FIG. 16.
Figure 18:
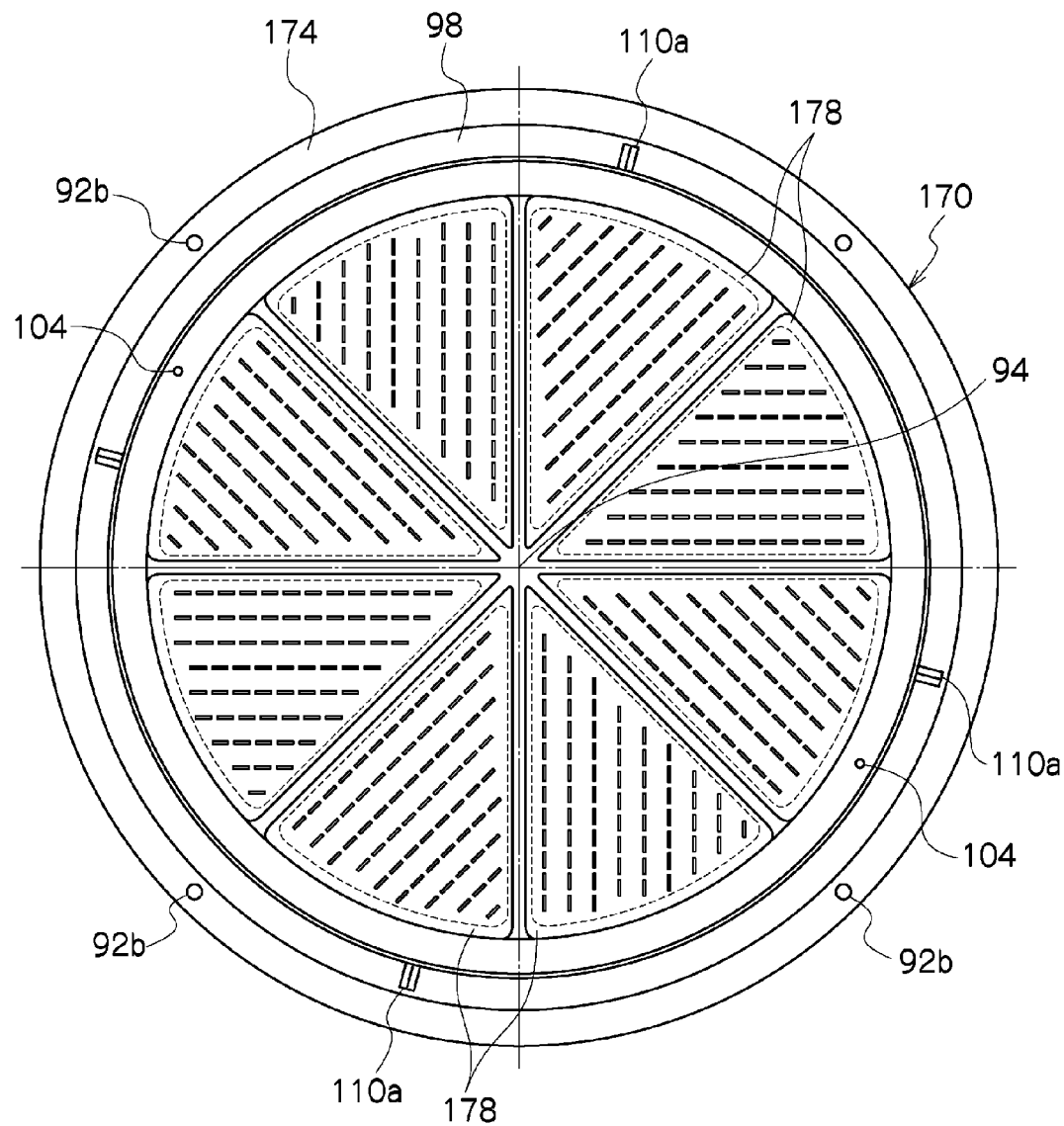
FIG. 18 is a plan view showing another embodiment of the connection unit.
Figure 19:
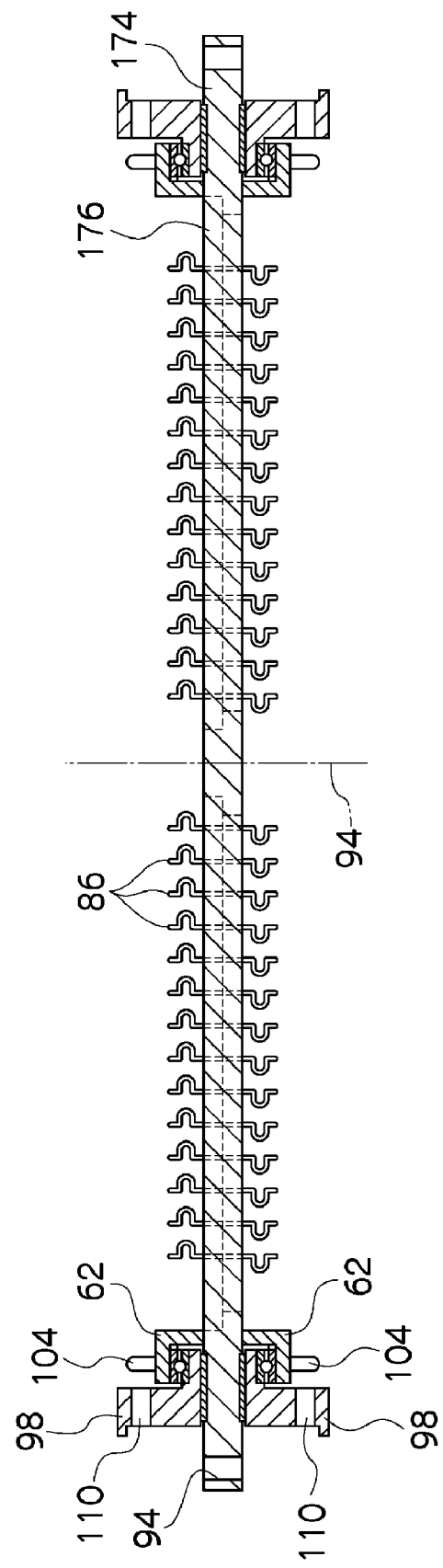
FIG. 19 is a vertical sectional view of the connection unit shown in FIG. 18.
Figure 20:
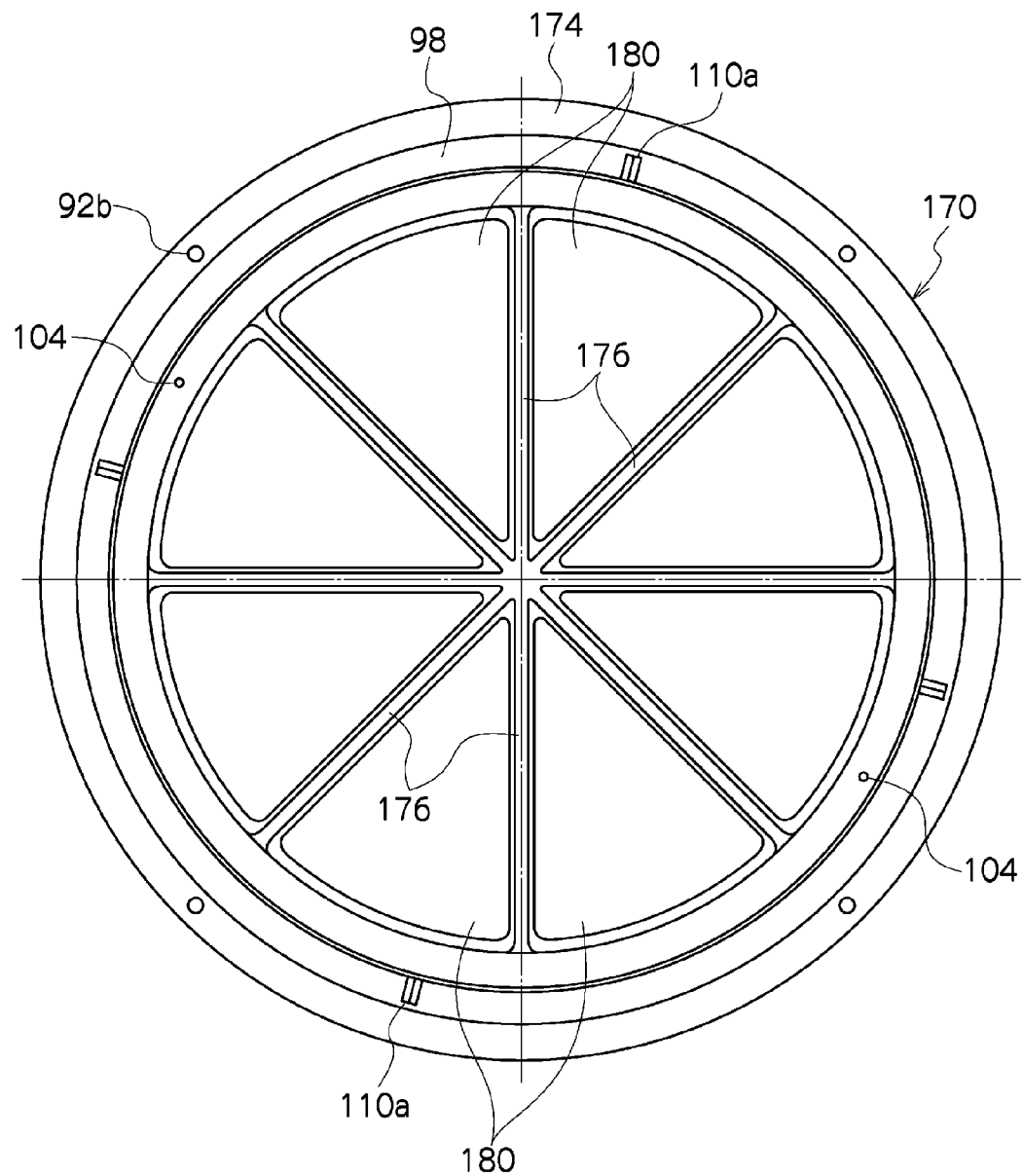
FIG. 20 is a plan view of the connection unit shown in FIG. 18 with the pin support piece removed.
Figure 21:
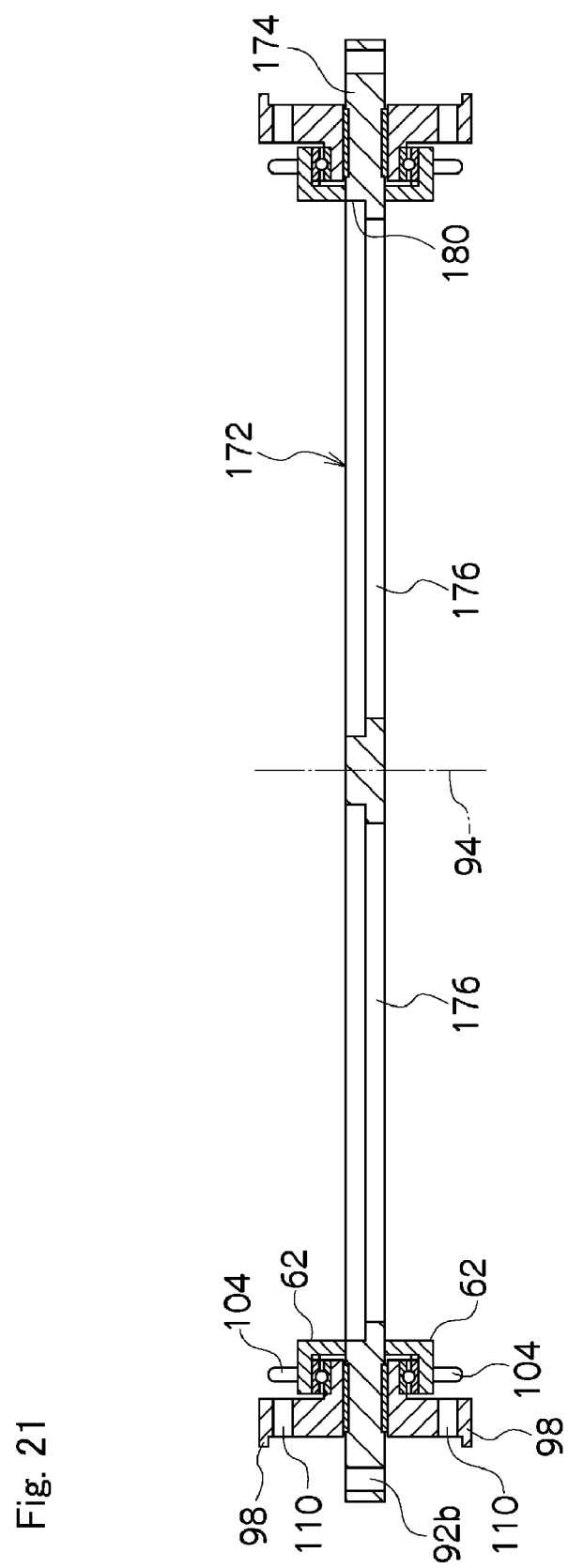
FIG. 21 is a vertical sectional view of the connection unit shown in FIG. 19.
Figure 22:
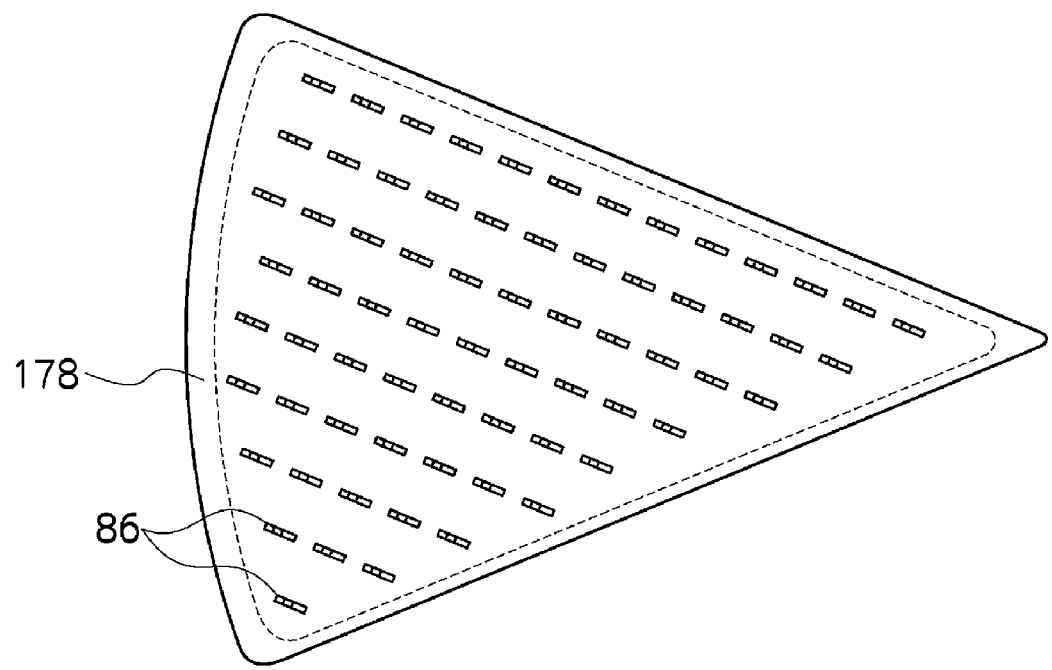
FIG. 22 is a plan view showing one embodiment of the pin support piece to be used in the connection unit shown in FIG. 18.
Figure 23:
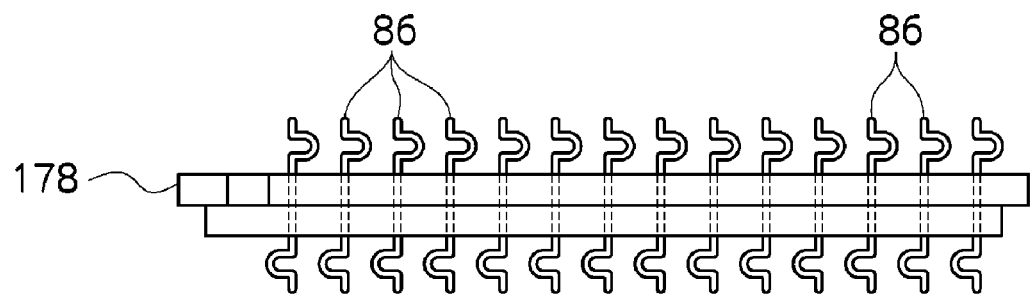
FIG. 23 is a front view of the pin support piece shown in FIG. 22.

Regarding the test chip 56, further explanation goes with reference to FIGS. 16 and 17.

Each test chip 56 is made to correspond to one of the devices under test (integrated circuits) which can be tested simultaneously by the test chip 56, generates a test signal, namely, a drive signal S3 for an electrical test of the corresponding device under test, and includes a plurality of signal processing circuits 130 for processing upon receipt of the response signal (S4) from the corresponding device under test, and a circuit 132 for delivering and receiving electrical signals to and from the signal processing circuits 130 and their external portions.

Those circuits 130, 132 are controlled by the computer 28 and actuated upon receipt of various data and electric power from the external units 26. Each signal processing circuit 130 is made to correspond to the device under test in one-to-one relationship, generates a drive signal S3 for an electrical test of the corresponding device under test, and processes upon receipt of the response signal S4 from the corresponding device under test. The delivering and receiving circuit 132 is used as a common circuit of all the signal processing circuits within the test chip 56.

Each signal processing circuit 130 has: a formatter (FMA) which generates a pulse signal S2 on the bases of pattern information S1 which is outputted from a pattern memory 156 and becomes a basis of a test signal, and a timing signal (timing clock) S12 outputted from a timing generator (TG) 148; a plurality of (N) drivers 136 for generating a drive signal S3 to drive the device under test on the basis of the pulse signal S2; a plurality of (N) comparison circuits 138 for outputting a defective signal S5 to the delivering and receiving circuit 132 upon receipt of a response signal S4 from the device under test, the defective signal S5 representing that a cell in the device under test is defective; a constant voltage/constant current generating circuit (PMU) 140 for generating a special test signal S6 for a special test to be used for a test of the device under test according to the constant voltage and constant current; and a clamp/load circuit 142 for protecting the signal processing circuit 130 from an excessive voltage inputting from the device under test to the signal processing circuit 130.

The drivers 136, the comparison circuits 138 and input/output terminals I/O to be explained later are, respectively, provided as many as the terminals of the device under test which can undergo a test simultaneously by one signal processing circuit 130 and correspond in one-to-one relationship to one of the cells of the device under test.

The common circuit, namely, the delivering and receiving circuit 132 has: a rate generator (RG) 144 which generates a reference test frequency signal S10 representing a reference test frequency for use in the test chip 56; a fail capture control (FCC) 146 for specifying defective cells of the device under test on the basis of the defective signal S5 to be outputted from each signal processing circuit 130; a timing generator (TG) 148 for generating a timing signal S7 corresponding to the reference test frequency signal S10, based on command from the reference test frequency signal S10 and the computer 28; and a pattern generator (PG) 150 for outputting an address signal S8 for making the pattern information S1 outputted (read) on the basis of the command from the computer 28.

The external unit 26 has a power source 152 for supplying the power to the signal processing circuits 130 and delivering and receiving circuits 132 of all the test chips 56; a plurality of (M) fail memories 154 for storing data which specify defective cells on the basis of defective signals S11 outputted from the fail capture control (FCC) 146 of all the test chips 56 and storing in the computer 28 so as to be able to read out; and a pattern memory 156 storing multiple test patterns, namely, pattern information for testing the function of the tester.

The computer 28 controls the external unit 26, each signal processing circuit 130 and the delivering and receiving circuit 132, permits setting of a signal frequency and a signal level according to the type of a test of the device under test, outputs a command to take in data relating to defective cells from the FFC circuit 146 to the FFC circuit, and takes such data relating to the defective cells into the internal memory of the computer 28 to store them.

In the following, to facilitate explanation and understanding thereof, command from the computer 28 is supposed to include the waveform shown in FIG. 17(D). Therefore, the device under test is driven by the drive signal (test signal) S3 having the waveform shown in FIG. 17(D).

The pattern generator 150 outputs, based on the command from the computer 28, the address signal S8 for outputting the pattern information S1 corresponding to the command to the pattern memory 156.

The pattern memory 156 generates the pattern information S1 corresponding to the address signal S8 supplied from the pattern generator (PG) 150, and outputs to the formatter 134 of each signal processing circuit 130.

The rate generator (RG) 144 outputs the reference test frequency signal S10 representing a period of generation of the signal frequency supplied from the computer 28 to each circuit within the test chip 56. In FIG. 17(A) is shown an example of such reference test frequency signal S10.

Meanwhile, the timing generator 148 generates a timing signal S12 as a fundamental clock to be used in the test chip 56.

Each formatter (MA) 134 generates the pulse signal S2 based on the pattern information S1 and the timing signal S12 and outputs to the corresponding driver 136. In FIG. 17(D) is shown an example of such pulse signal S2.

Each driver 136 generates the drive signal S3 for driving the corresponding cell of the device under test on the basis of the pulse signal S2 and outputs to the corresponding input/output terminal of the device under test through each corresponding input/output terminal (I/O). An example of such a drive signal S3 is shown in FIG. 17(E). The input/output terminals I/O are provided as many as the number (N) of the cells of the device under test which can be tested simultaneously by one signal processing circuit 130.

The device under test, particularly the response signal S4 from each cell, when the corresponding driver 136 is off, inputs into each signal processing circuit 130 in a form of a pulse signal through the corresponding input/output portion I/O and is received by the corresponding comparison circuit 138.

Each comparison circuit 138 has: a plurality of first analog comparator 160 for comparing the response signal S4 from the corresponding cell with an H reference signal VOH having a positive side (high level side) reference signal level; a plurality of second analog comparators 162 for comparing the response signal S4 from the corresponding cell with an L reference signal VOL having a negative side (low level side) reference signal level; and a defective signal generating circuit 164 which outputs the defective signal S5 relating to the corresponding cell, based on the output signals of both analog comparators 160 and 162.

When the corresponding response signal S4 exceeds the H reference signal VOH, each first analog comparator 160 outputs to the defective signal generating circuit 164 per cell an abnormal signal representing that the H side signal from the corresponding cell is abnormal and that the cell is defective.

When the corresponding response signal S4 has not reached the negative reference signal VOL, each second analog comparator 162 outputs to the defective signal generating circuit 164 an abnormal signal representing that an L-side signal from the corresponding cell is abnormal and that the cell is defective.

Each defective signal generating circuit 164 outputs the defective signal S5 relating to the corresponding cell to the fail capture control (FCC) 146 of the delivering and receiving circuit 132, based on inputting of abnormal signals of the corresponding first and second analog comparator 160 and 162. Therefore, the defective signal S5 includes information to specify the defective cell in the device under test and its coordinate position.

In this embodiment, since a plurality of (N) cells are tested simultaneously by each signal processing circuit 130, the first and second analog comparators 160 and 162 determine whether the response signal S4 from the corresponding cell is good or not at a predetermined timing and generates a signal representing abnormality on the H-side and L-side. Therefore, the defective signal generating circuit 164 specifies the defective cell and its coordinate position by the timing that a signal representing the abnormality is inputted from the analog comparator 160 or 162.

The fail capture control (FCC) 146 specifies the defective cell every time the defective signal S5 is outputted from each signal processing circuit 130 and outputs to the external unit 26.

As mentioned above, each signal processing circuit 130 makes each cell of the corresponding device under test driven by the drive signal S3 from the driver 136, receives the response signal S4 corresponding to the driving state of each cell, and determines whether each cell is good or not.

The constant voltage/constant current generating circuit (PMU) 140 is a test unit for a specific test using a highly accurate direct current signal (DC), and when conducting such a specific test of the device under test, generates the specific test signal S6 of a highly accurate constant voltage and constant current, outputs to the input/output terminal (I/O), and conducts a voltage/current test of the device under test. The constant voltage/constant current generating circuit (PMU) 140, when it outputted a current, measures the voltage from the device under test, and when it outputted a voltage, measures the current from the device under test.

The clamp/load circuit 142 is a so-called clamp-high and clamp-low circuit, when the voltage level of the response signal S4 to be inputted from the device under test to the signal processing circuit 130 is an excess voltage over a reference value, protects inputting of the response signal S4 to the signal processing circuit 130. By this, the signal processing circuit 130 is protected from the excess voltage response signal S4.

Another Embodiment of the Connection Unit

Referring to FIGS. 18 through 23, a plate-like ring 172 of a connection unit 170 has: a ring portion 174 extending about the imaginary axis 94 like the ring 92 of the pin support 88; and a plurality of linear portions 176 extending from the ring portion 174 toward the center of the radius of curvature of the ring portion 174 to be connected mutually at the central portion of the ring portion 174.

The pin support 88 has a plurality of fan-shaped plate-like pin support pieces 178 arranged in each space 180 which is formed by the ring portion 174 and adjoining linear portions 176. In each pin support piece 178, a plurality of connection pins 86 are held in a state of penetrating the support piece 178. These support pieces form a pin holder together with each other.

A stage portion receiving the pin support pieces 178 is formed in both side portions of the inside of the ring portion 174 and each linear portion 176. The pin support pieces 178 are attached to the stage portion of the ring portion 174 with a plurality of screw members (not shown).

According to the connection unit 170, the pin support 172 extends from the ring portion 174 toward the imaginary line 94 and is reinforced by a plurality of linear portions 176 mutually coupled at the central portion, so that, even if the probe unit 78, particularly the central portion of the probe base plate 80, is deformed downward or upward in a high temperature test by thermal expansion, such thermal deformation is constrained, thereby preventing any change in the tip position of the contact 44 following the thermal deformation.

Another Embodiment of the Connection Pin

Figure 24:
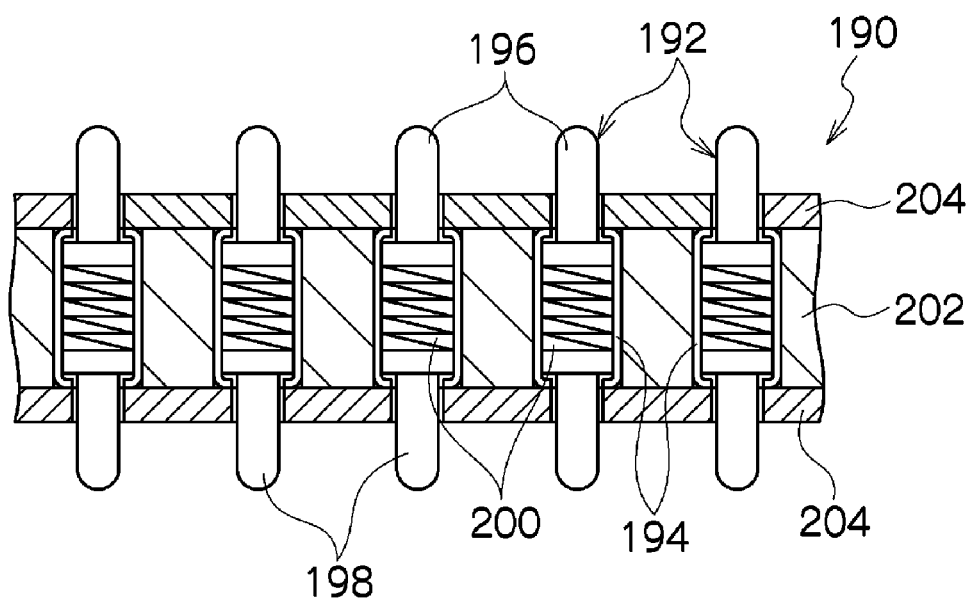
FIG. 24 is a vertical sectional view showing a part of one embodiment of the connection unit using another connection pin.

Referring to FIG. 24, a pin support 190 uses a pogo pin as a connection pin 192.

Each pogo pin, namely, each connection pin 192 has: a cylindrical member 194; a first pin member 196 disposed at one end portion of the cylindrical member 194 so as to be movable in the longitudinal direction of the cylindrical member 194; a second pin member 198 disposed at the other end portion of the cylindrical member 194 so as to be movable in the longitudinal direction of the cylindrical member 194; and a compression coil spring 200 which is disposed within the cylindrical member 194 between the first and second pin members 196 and 198 to energize the first and second pin members 196 and 198 in directions for the front end portions are projected from the one end portion and the other end portion of the cylindrical member 194, respectively (in other words, the directions for the first and second pin members 196 and 198 to be away from each other).

The cylindrical member 194, the first and second pin members 196 and 198, and the coil spring 200 are all made of an electrically conductive material. The first and second pin members 196 and 198 are held at the cylindrical member 194 so as not to fall off.

Each connection pin 192 is held at the cylindrical member 194 so as not to fall off. To each of the upside and underside of the pin holder 202 is secured a holding sheet 204 made of an electrically insulating material. The first and second pin members 196 and 198 penetrate the upper-side and lower-side sheet members 204.

However, the cylindrical member 194 does not penetrate both sheet members 204 and has its upper end and lower end abut on the sheet members 204. Thus, each connection pin 192 is prevented from falling out of the pin holder 202 since the cylindrical member 194 is positioned at the holder 202.

In each of the above-mentioned embodiments, each contact 44 may be one having another known structure and shape such as one using a thin metal wire as described in Japanese Patent Appln. Public Disclosure No. 2008-145224 (which is incorporated herein by reference), one using a pogo pin having the shape and structure as shown in FIG. 24, etc.

In place of the test chip having a function such as mentioned above, the present invention can be applied to an apparatus provided with a unit using other parts such as a relay, a capacitor, a resistor and the like, for each of the electronic parts 56.

The present invention can be also applied not only to an apparatus in which the cam surface 100c is formed by the cam slot 110 such as the foregoing, but also to an apparatus using another cam surface such as one using a cam surface formed to open upward on the upper surface of the rotary ring 98 in FIG. 15, for example.

The present invention can be further applied to an apparatus using coupling units other than the coupling units 52, 54, the displacing mechanism 74 and the drive mechanism 112 as mentioned above.

The present invention is not limited to the foregoing embodiments but may be altered in various ways without departing from the spirit described in the scope of claims for patent.

What is claimed is:

1. An apparatus for testing an integrated circuit, comprising:
    a chip unit provided with a chip support and a plurality of electronic parts arranged on the upside of said chip support;
    a probe unit distanced downward from said chip unit, the probe unit including a probe support and a plurality of contacts arranged on the underside of the probe support;
    a connection unit disposed between said chip unit and said probe unit so as to electrically connect them and including a pin support as well as a plurality of connection pins supported on said pin support so as to penetrate said pin support in an up-down direction; and
    a coupling unit coupling separably said chip unit, said probe unit and said connection unit and displacing at least either said chip unit or said probe unit and said connection unit in a direction to approach each other and to be away from each other relative to said connection unit; wherein
    coupling unit is provided with: a thrust bearing apparatus disposed in the one of said chip unit and said probe unit as well as in said pin support and coupling them displaceably in a direction to approach each other and to be away from each other, said bearing apparatus extending about an imaginary axis which extends in an up-down direction through said pin support and said probe support; a rotary ring disposed between said pin support and said bearing apparatus angularly rotatably about said imaginary axis; and a displacing mechanism for displacing said rotary ring about said imaginary axis and displacing the one of said chip unit and said probe unit and said pin support in a direction to approach each other and to be away from each other.

2. A testing apparatus claimed in claim 1, wherein said displacing mechanism is provided with:
    a cam follower extending from the one of said chip unit and said probe unit radially outward of an imaginary circle about said imaginary axis;
    a cam slot formed in said rotary ring and having an inlet portion for receiving said cam follower from the side of the one of said chip unit and said probe unit and a cam portion communicated to said inlet portion and extending about said imaginary axis from said inlet portion; and
    a drive mechanism for displacing said rotary ring about said imaginary axis relative to said connection unit; and
    wherein said cam portion has a cam surface inclined to the one of said chip unit and said probe unit such that a portion distal to said inlet portion becomes closer to the side of either said chip unit or said probe unit.

3. The testing apparatus claimed in claim 2, wherein said cam surface has a recess concave on the side opposing the side of the one of said chip unit and said probe unit at each of plural positions at intervals about said imaginary axis.

4. The testing apparatus claimed in claim 1, wherein said bearing apparatus is provided with:
a bearing holder coupled with the one of said chip unit and said probe unit and said pin support; and
an annular thrust bearing disposed between the one of said chip unit and said probe unit and said bearing holder, said thrust bearing having said rotary ring coupled therewith.

5. The testing apparatus claimed in claim 4, wherein said bearing holder is coupled with said chip unit or said probe unit so as to be relatively displaceable in an up-down direction and not to be relatively displaceable about an imaginary axis extending in an up-down direction through said chip support, said pin support and said probe support.

6. The testing apparatus claimed in claim 1, wherein said coupling unit further comprises:
a second bearing apparatus disposed between the other of said chip unit and said probe unit and said connection unit and extending about said imaginary axis;
a second rotary ring disposed between said connection unit and said second bearing apparatus; and
a second displacing mechanism for displacing said second rotary ring about said imaginary axis relative to said connection unit and displacing the other of said chip unit and said probe unit and said connection unit in a direction to approach each other and to be away from each other.

7. The testing apparatus claimed in claim 1, wherein:
said chip support is provided with a first ring having a disk-shaped chip base plate with said electronic parts disposed on the upside and having a first opening in which said chip base plate is disposed;
said probe support is provided with a disk-shaped probe base plate with said contacts disposed on the underside, and a second opening in which said probe base plate is disposed;
said pin support is provided with a plate-like pin holder disposed such that said connection pins penetrate in an up-down direction, and a third opening in which said pin holder is disposed; and
said coupling unit couples said first, second and third rings to one another displaceably in a direction to approach one another and to be away from one another.

8. The testing apparatus claimed in claim 7, wherein each connection pin is provided with:
a main body portion penetrating said pin holder in an up-down direction;
an upper tip portion integrally continuing to the upper end of the main body portion and projecting upward from said pin holder; and
a lower tip portion integrally continuing to the lower end of said main body portion and projecting downward from said pin holder.

9. The testing apparatus claimed in claim 7, wherein each connection pin includes a pogo pin having a pair of pin members spaced apart in an up-down direction, and a spring member disposed between both said pin members and energizing both said pin members in a direction for the front end portions of both said pin members to be projected rearward and downward, respectively, from said pin support; and
wherein said pin support is further provided with an electrically insulating sheet member disposed, respectively, on the upper and lower surfaces of said pin holder, said sheet member having a hole which permits the front end portions of said pin members to project from said sheet members.

10. The testing apparatus claimed in claim 1, wherein said pin support includes:
a ring portion extending about an imaginary axis which extends in an up-down direction through said chip support, said pin support and said probe support; a ring extending from said ring portion toward said imaginary axis and having a plurality of linear portions mutually coupled at the central portion of said ring portion; and
a pin holder formed by a plurality of fan-shaped plate-like pin support pieces which are disposed in each space made by said ring portion and said adjoining linear portions and each of which holds the plural connection pins.

11. The testing apparatus claimed in claim 10, wherein each connection pin is provided with:
a main body portion penetrating said pin holder in an up-down direction;
an upper tip portion integrally continuing to the upper end of the main body portion and projecting upward from said pin holder; and
a lower tip portion integrally continuing to the lower end of said main body portion and projecting downward from said pin holder.

12. The testing apparatus claimed in claim 10, wherein each connection pin includes a pogo pin having a pair of pin members spaced apart in an up-down direction, and a spring member disposed between both said pin members and energizing both said pin members in a direction for the front end portions of both said pin members to be projected rearward and downward, respectively, from said pin support; and
wherein said pin support is further provided with an electrically insulating sheet member disposed, respectively, on the upper and lower surfaces of said pin holder, said sheet member having a hole which permits the front end portions of said pin members to project from said sheet members.

13. The apparatus for testing an integrated circuit claimed in claim 1, further comprising a support base for supporting the outer rim portion of said pin support.

14. The testing apparatus claimed in claim 1, wherein each electronic part includes accumulated test chips which generate an electrical signal for use in an electrical test of a device under test and process upon receipt of a response signal from said device under test.

* * * * *